(12) United States Patent
Lee et al.

(10) Patent No.: US 10,971,485 B2
(45) Date of Patent: Apr. 6, 2021

(54) SOLENOID INDUCTORS WITHIN A MULTI-CHIP PACKAGE

(71) Applicant: Taiwan Semiconductor Manufacturing Co., Ltd., Hsinchu (TW)

(72) Inventors: Hui Yu Lee, Hsinchu (TW); Ka Fai Chang, Hsinchu (TW)

(73) Assignee: Taiwan Semiconductor Manufacturing Co., Ltd.

( * ) Notice: Subject to any disclaimer, the term of this patent is extended or adjusted under 35 U.S.C. 154(b) by 94 days.

(21) Appl. No.: 16/283,017

(22) Filed: Feb. 22, 2019

(65) Prior Publication Data

US 2020/0135709 A1 Apr. 30, 2020

Related U.S. Application Data

(60) Provisional application No. 62/753,226, filed on Oct. 31, 2018.

(51) Int. Cl.
*H01L 25/18* (2006.01)
*H01L 23/538* (2006.01)
(Continued)

(52) U.S. Cl.
CPC .......... *H01L 25/18* (2013.01); *H01L 23/3128* (2013.01); *H01L 23/481* (2013.01); *H01L 23/49811* (2013.01); *H01L 23/5227* (2013.01); *H01L 23/5383* (2013.01); *H01L 23/5384* (2013.01); *H01L 23/5385* (2013.01);
(Continued)

(58) Field of Classification Search
CPC ............ H01L 23/481; H01L 23/49811; H01L 23/5389; H01L 24/16; H01L 2224/0401; H01L 24/04; H01L 2224/16227; H01L 25/18; H01L 23/5384; H01L 23/5227; H01L 23/5385; H01L 23/3128; H01L 23/645; H01L 23/5383; H01L 25/50
See application file for complete search history.

(56) References Cited

U.S. PATENT DOCUMENTS

| | | | |
|---|---|---|---|
| 2014/0035892 A1* | 2/2014 | Shenoy | H01L 23/49827 345/205 |
| 2014/0092574 A1* | 4/2014 | Zillmann | G06F 1/3296 361/782 |
| 2020/0066830 A1* | 2/2020 | Bharath | H01L 23/645 |

* cited by examiner

*Primary Examiner* — Fernando L Toledo
*Assistant Examiner* — Adam S Bowen
(74) *Attorney, Agent, or Firm* — Sterne, Kessler, Goldstein & Fox P.L.L.C.

(57) ABSTRACT

An exemplary multi-chip package includes one or more solenoid inductors. An exemplary enclosing IC package includes one or more electrical interconnections propagating throughout which can be arranged to form a first solenoid inductor situated within the exemplary multi-chip package. Moreover, the exemplary enclosing IC package can be connected to an exemplary enclosed IC package to form the exemplary multi-chip package. The exemplary enclosed IC package can include a second solenoid inductor formed therein. Furthermore, the exemplary enclosing IC package can include a first portion of a third solenoid inductor and the exemplary enclosed IC package can include a second portion of the third solenoid inductor. The exemplary enclosed IC package can be connected to the exemplary enclosing IC package to connect the first portion of the third solenoid inductor and the second portion of the third solenoid inductor to form the third solenoid inductor.

20 Claims, 12 Drawing Sheets

(51) Int. Cl.
*H01L 23/64* (2006.01)
*H01L 23/48* (2006.01)
*H01L 23/31* (2006.01)
*H01L 23/522* (2006.01)
*H01L 23/498* (2006.01)
*H01L 25/00* (2006.01)
*H01L 23/00* (2006.01)

(52) U.S. Cl.
CPC ........ *H01L 23/5389* (2013.01); *H01L 23/645* (2013.01); *H01L 25/50* (2013.01); *H01L 24/04* (2013.01); *H01L 24/16* (2013.01); *H01L 2224/0401* (2013.01); *H01L 2224/16227* (2013.01)

SOLENOID INDUCTORS WITHIN A MULTI-CHIP PACKAGE

CROSS-REFERENCE TO RELATED APPLICATIONS

The present application claims the benefit of U.S. Provisional Patent Appl. No. 62/753,226, filed Oct. 31, 2018, which is incorporated herein by reference in its entirety.

BACKGROUND

A conventional enclosing IC package represents a foundation for mechanically and electrically connecting one or more System on Chip (SoC) packages to other electrical, mechanical, and/or electro-mechanical devices. Conventionally, the conventional enclosing IC package includes one or more electrical interconnections situated between the one or more SoC packages and these other electrical, mechanical, and/or electro-mechanical devices which spread apart as they traverse from the one or more SoC packages to these other electrical, mechanical, and/or electro-mechanical devices. This spreading, also referred to as fan-out, of the one or more electrical interconnections allows more real estate for mechanically and electrically connecting the conventional enclosing IC package to these other electrical, mechanical, and/or electro-mechanical devices. Moreover, the conventional enclosing IC package is mechanically and electrically connected to a conventional enclosed IC package. The conventional enclosed IC package represents a semiconductor package having one or more integrated circuits (ICs) formed therein. The conventional enclosing IC package mechanically and electrically connect the conventional enclosed IC package to the one or more SoC packages of the enclosing IC package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
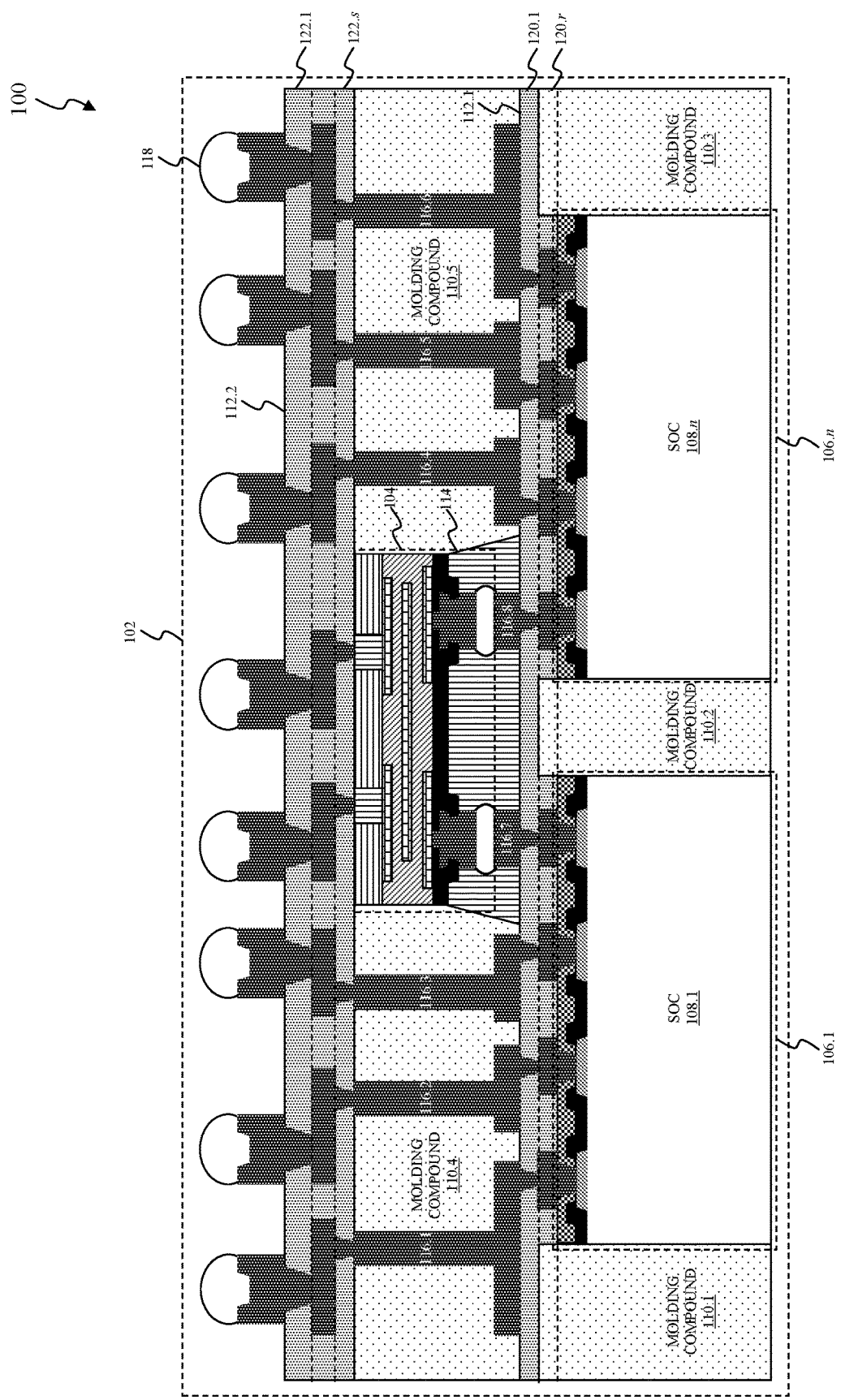
FIG. 1 illustrates a cross-sectional diagram of an exemplary multi-chip package according to an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition does not in itself dictate a relationship between the various embodiments and/or configurations described.

Overview

An exemplary multi-chip package includes one or more solenoid inductors. An exemplary enclosing IC package includes one or more electrical interconnections propagating throughout which can be arranged to form a first solenoid inductor situated within the exemplary multi-chip package. Moreover, the exemplary enclosing IC package can be connected to an exemplary enclosed IC package to form the exemplary multi-chip package. The exemplary enclosed IC package can include a second solenoid inductor formed therein. Furthermore, the exemplary enclosing IC package can include a first portion of a third solenoid inductor and the exemplary enclosed IC package can include a second portion of the third solenoid inductor. The exemplary enclosed IC package can be connected to the exemplary enclosing IC package to connect the first portion of the third solenoid inductor and the second portion of the third solenoid inductor to form the third solenoid inductor.

Exemplary Multi-Chip Package

FIG. 1 illustrates a cross-sectional diagram of an exemplary multi-chip package according to an exemplary embodiment of the present disclosure. In the exemplary embodiment illustrated in FIG. 1, a multi-chip package 100 represents a three-dimensional semiconductor stacking structure which can include one or more solenoid inductors as to be described in further detail below in FIG. 4. As illustrated in FIG. 1, the multi-chip package 100 includes an enclosing integrated circuit (IC) package 102 mechanically and electrically connected to an enclosed IC package 104. As to be described in further detail below, the enclosing IC package 102 represents a foundation for mechanically and electrically connecting one or more System on Chip (SoC) packages to other electrical, mechanical, and/or electro-mechanical devices. The enclosing IC package 102 includes one or more electrical interconnections situated between the one or more SoC packages and these other electrical, mechanical, and/or electro-mechanical devices which spread apart as they traverse from the one or more SoC packages to these other electrical, mechanical, and/or electro-mechanical devices. This spreading, also referred to as fan-out, of the one or more electrical interconnections allows more real estate for mechanically and electrically connecting the enclosing IC package 102 to these other electrical, mechanical, and/or electro-mechanical devices. As to be described in further detail below in FIG. 4, the one or more electrical interconnections can be configured and arranged to form a first solenoid inductor situated within the multi-chip package 100. Moreover, the enclosed IC package 104 is mechanically and electrically connected to the enclosing IC package 102 to form the multi-chip package 100. Furthermore, as to be described in further detail below in FIG. 4, the enclosing IC package 102 package can include a first portion of a third solenoid inductor and the enclosed IC package 104 package can include a second portion of the third solenoid inductor. The enclosed IC package 104 package can be connected to the enclosing IC package 102 to connect the first portion of the third solenoid inductor and the second portion of the third solenoid inductor to form the third solenoid inductor.

In the exemplary embodiment illustrated in FIG. 1, the enclosing IC package 102 includes System on Chip (SoC) packages 106.1 through 106.$n$, each of SoC packages 106.1 through 106.$n$ including a corresponding SOC from among SOCs 108.1 through 108.$n$. The SoC packages 106.1 through 106.$n$ are to be described in further detail below in FIG. 2. As illustrated in FIG. 1, the enclosing IC package 102 additionally includes regions of molding compound 110.1 through 110.5, illustrated using a light dotted shading in FIG. 1. The regions of molding compound 110.1 through 110.5 can include one or more organic resins, such as epoxy resin to provide an example, and one or more catalyst accelerate to cure the one or more organic resins. In some situations, the regions of molding compound 110.1 through 110.5 can additionally include other materials, such as flame retardants, adhesion promoters, ion traps, and/or stress relievers to provide some examples. In the exemplary embodiment illustrated in FIG. 1, the regions of molding compound 110.1 through 110.3 are situated within the enclosing IC package 102 to encapsulate the SoC packages 106.1 through 106.$n$.

Moreover, the enclosing IC package 102 includes a first interposer 112.1 and a second interposer 112.2, illustrated using the medium dotted shading in FIG. 1, situated onto the SoC packages 106.1 through 106.$n$ and/or the regions of molding compound 110.1 through 110.3 to form a foundation for mechanically connecting the enclosing IC package 102 and the enclosed IC package 104 and situated onto the enclosed IC package 104, respectively. The first interposer 112.1 and a second interposer 112.2, illustrated using a medium dotted shading in FIG. 1, can include one or more non-conductive materials, such as silicon dioxide ($SiO_2$) or nitride ($N^{3-}$) to provide some examples, to form the foundation for mechanically connecting the enclosing IC package 102 and the enclosed IC package 104. In an exemplary embodiment, the first interposer 112.1 and the second interposer 112.2 can be characterized as including multiple layers 120.1 through 120.$r$ and multiple layers 122.1 through 122.$s$, respectively, of a semiconductor stack. For example, the first interposer 112.1 can be characterized as including two (2) layers 120.1 and 120.2 of the semiconductor stack and the second interposer 112.2 can be characterized as including three (3) layers 122.1 through 122.3 of the semiconductor stack. In this exemplary embodiment, the first interposer 112.1 and the second interposer 112.2 can include one or more conductive materials, such as tungsten (W), aluminum (Al), copper (Cu), gold (Au), silver (Ag), or platinum (Pt) to provide some examples, situated within these multiple layers of the semiconductor stack. The one or more conductive materials of the first interposer 112.1 and the second interposer 112.2 can form various electrical connections between the enclosing IC package 102 and other electrical, mechanical, and/or electro-mechanical devices, between the enclosed IC package 104 and other electrical, mechanical, and/or electro-mechanical devices, and/or between the enclosing IC package 102 and the enclosed IC package 104. In another exemplary embodiment, one or more passive devices, such as first solenoid inductor, the second solenoid inductor, and/or the third solenoid inductor as to be described below in FIG. 4, can be implemented within the multiple layers 120.1 through 120.$r$ and the multiple layers 122.1 through 122.$s$ of the semiconductor stack. In the exemplary embodiment illustrated in FIG. 1, the enclosing IC package 102 further includes a non-conductive platform 114, illustrated using a vertical shading in FIG. 1, to mechanically connect the enclosed IC package 104 and the first interposer 112.1. The non-conductive platform 114 can include the one or more non-conductive materials as described above. In an exemplary embodiment, the non-conductive platform 114 is implemented as a three-dimensional trapezoidal structure, however, other structures are possible as will be recognized by those skilled in the relevant art(s) without departing from the spirit and scope of the present disclosure.

In the exemplary embodiment illustrated in FIG. 1, the regions of molding compound 110.4 through 110.5 are situated within the enclosing IC package 102 to encapsulate the enclosed IC package 104. As illustrated in FIG. 1, the enclosing IC package 102 includes one or more regions of conductive material 116.1 through 116.8, illustrated using a dark dotted shading in FIG. 1, to form one or more electrical connections between the SoC packages 106.1 through 106.$n$ and other electrical, mechanical, and/or electro-mechanical devices and/or between the enclosed IC package 104 and the SoC packages 106.1 through 106.$n$. As illustrated in FIG. 1, the one or more electrical interconnections spread apart as they traverse from the first interposer 112.1 to the second interposer 112.2. This spreading, also referred to as fan-out, of the one or more electrical interconnections allows more real estate for mechanically and electrically connecting the multi-chip package 100 to other electrical, mechanical, and/or electro-mechanical devices. The one or more regions of conductive material 116.1 through 116.8 can include the one or more conductive materials as described above. In the exemplary embodiment illustrated in FIG. 1, the one or more regions of conductive material 116.1 through 116.6 traverse through the regions of molding compound 110.4 through 110.5. In this exemplary embodiment, these regions of conductive material 116.1 through 116.6 traversing through the regions of molding compound 110.4 through 110.5 can be referred to as through CR via (TCRV) structures. Moreover, the arrangement of the one or more regions of conductive material 116.1 through 116.8 as illustrated in FIG. 1 is for illustrative purposes only, those skilled in the relevant art(s) will recognize other configurations and arrangements of the one or more regions of conductive material 116.1 through 116.8 are possible without departing from the spirit and scope of the present disclosure. Furthermore, those skilled in the relevant art(s) will recognize more or less regions of conductive material 116 are possible without departing from the spirit and scope of the present disclosure. In an exemplary embodiment, the one or more regions of conductive material 116.1 through 116.8 can be used to implement one or more passive devices, such as the first solenoid inductor, the second solenoid inductor, and/or the third solenoid inductor as to be described below in FIG. 4.

As illustrated in FIG. 1, the enclosing IC package 102 includes the second interposer 112.2, illustrated using the medium dotted shading in FIG. 1, situated onto the enclosed IC package 104 and/or the regions of molding compound 110.4 through 110.5 to form a foundation for mechanically and/electrically connecting the enclosing IC package 102 and the enclosed IC package 104 to the other electrical, mechanical, and/or electro-mechanical devices. The second interposer 112.2 can include the one or more non-conductive materials as described above. Moreover, the enclosing IC package 102 includes one or more electrical connections 118 for electrically connecting the enclosing IC package 102 and/or the enclosed IC package 104 to these other electrical, mechanical, and/or electro-mechanical devices. In the exemplary embodiment illustrated in FIG. 1, the one or more electrical connections 118 represent solder balls, also referred to as solder bumps, for electrically connecting the enclosing IC package 102 and/or the enclosed IC package 104 to these other electrical, mechanical, and/or electro-mechanical devices, however, other mechanisms are possible for electrically connecting the enclosing IC package 102 and/or the enclosed IC package 104 to these other electrical, mechanical, and/or electro-mechanical devices as will be recognized by those skilled in the relevant art(s) without departing from the spirit and scope of the present disclosure.

Figure 2:
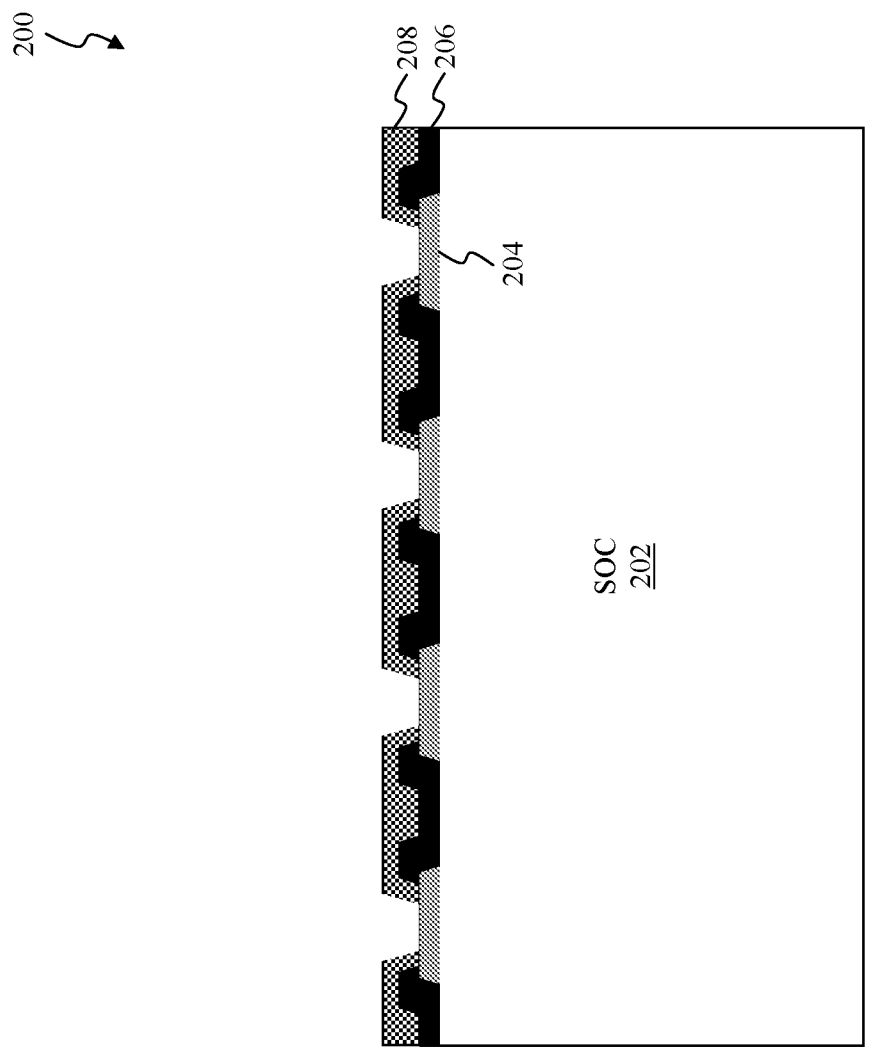
FIG. 2 illustrates a cross-sectional diagram of an exemplary system on chip (SoC) package that can be implemented within the exemplary multi-chip package according to an exemplary embodiment of the present disclosure.

Exemplary System on Chip Package That Can Be Implemented Within the Exemplary Multi-Chip Package FIG. 2 illustrates a cross-sectional diagram of an exemplary system on chip (SoC) package that can be implemented within the exemplary multi-chip package according to an exemplary embodiment of the present disclosure. An SoC package 200 as illustrated FIG. 2 can represent an exemplary embodiment of one or more of the SoC packages 106.1 through 106.n as described above in FIG. 1. Referring to FIG. 2, the SoC package 200 can include an SoC 202. The SoC 202 can include one or more suitable electrical, mechanical, and/or electro-mechanical devices which are mechanically and electrically integrated onto one or more semiconductor substrates. The one or more semiconductor substrates can include a silicon crystal semiconductor substrate, as well as other materials, or combinations of materials, such as sapphire or any other suitable material that will be apparent to those skilled in the relevant art(s) without departing from the spirit and scope of the present disclosure. In an exemplary embodiment, these suitable electrical, mechanical, and/or electro-mechanical devices can implement one or more digital functions, one or more analog functions, and/or one or more mixed-signal functions. As to be described in more detail below, these functions can be implemented to dynamically vary an inductance of one or more solenoid inductors which are to be described in further detail below in FIG. 4.

As illustrated in FIG. 2, the SoC 202 includes one or more input/output (I/O) ports 204, illustrated using a gray shading in FIG. 2, for interfacing with other electrical, mechanical, and/or electro-mechanical devices, such as the enclosing IC package 102 and/or the enclosed IC package 104 as described above in FIG. 1 to provide some examples. In an exemplary embodiment, the one or more I/O ports 204 transmit to and/or receive various signals from these other electrical, mechanical, and/or electro-mechanical devices. In the exemplary embodiment illustrated in FIG. 2, the one or more I/O ports 204 can include the one or more conductive materials as described above in FIG. 1. In the exemplary embodiment illustrated in FIG. 2, the SoC 202 can include an isolation region 206, illustrated using a dark black shading in FIG. 2, to separate the one or more I/O ports 204 from each other. The isolation region 206 can include the one or more non-conductive materials as described above in FIG. 1. Moreover, the SoC 202 can include a region of encapsulation material 208, illustrated using a hatched shading in FIG. 2, to prevent physical damage, for example, corrosion, to the SoC 202. The region of encapsulation material 208 can include one or more encapsulation materials, such as plastic, for example, thermoset or thermoplastic, and/or ceramic to provide some examples. In the exemplary embodiment illustrated in FIG. 2, the region of encapsulation material 208 includes one or more notches or holes to expose the one or more I/O ports 204 to allow electrical connection between the one or more I/O ports 204 and the other electrical, mechanical, and/or electro-mechanical devices.

Figure 3:
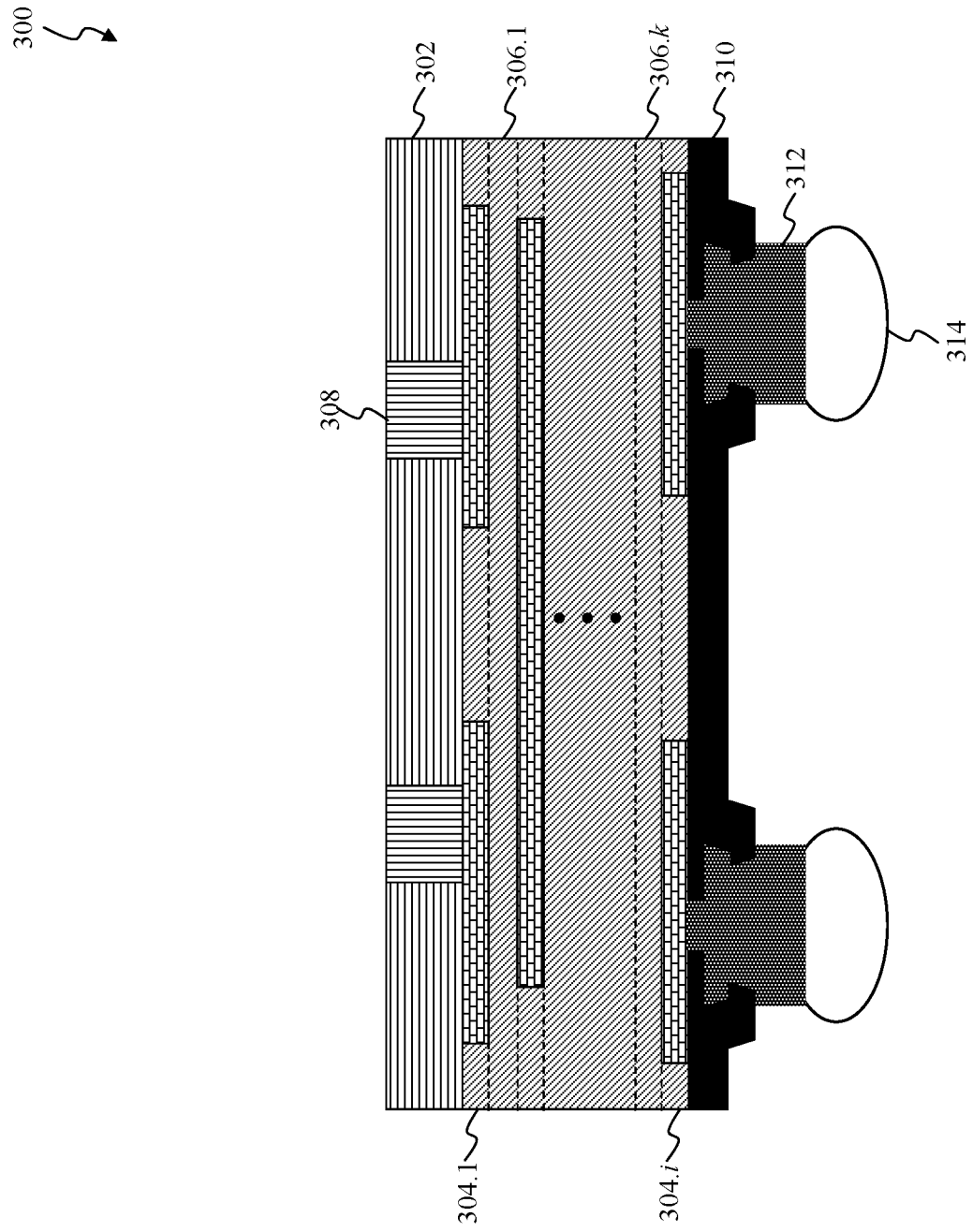
FIG. 3 illustrates a cross-sectional diagram of an exemplary enclosed IC package that can be implemented within the multi-chip package according to an exemplary embodiment of the present disclosure.

Exemplary Chip on Wafer on Substrate Package That Can Be Implemented Within the Exemplary Multi-Chip Package FIG. 3 illustrates a cross-sectional diagram of an exemplary enclosed IC package that can be implemented within the exemplary multi-chip package according to an exemplary embodiment of the present disclosure. An enclosed IC package 300 as illustrated FIG. NW can represent an exemplary embodiment of the enclosed IC package 104 as described above in FIG. 1. Referring to FIG. 3, the enclosed IC package 300 includes a semiconductor substrate 302, illustrated using horizontal shading in FIG. 3, such as a silicon crystal semiconductor substrate to provide an example. The semiconductor substrate 302 can include semiconductor substrate 302 other materials, or combinations of materials, such as sapphire, organic materials, or any other suitable material that will be apparent to those skilled in the relevant art(s) without departing from the spirit and scope of the present disclosure. In some situations, the semiconductor substrate 302 can be used to implement one or more active devices of one or more electrical, mechanical, and/or electro-mechanical devices.

In the exemplary embodiment illustrated in FIG. 3, the enclosed IC package 300 includes conductive layers 304.1 through 304.i interdigitated with non-conductive layers 306.1 through 306.k. As illustrated in FIG. 3, the conductive layers 304.1 through 304.i includes one or more regions, shown using a rectangular shading in FIG. 3, of the one or more conductive materials as described above in FIG. 1. In an exemplary embodiment, the conductive layers 304.1 through 304.*i* can be used to implement various interconnections between the one or more active devices of the one or more electrical, mechanical, and/or electro-mechanical devices and/or can be used to implement one or more passive devices, such as the first solenoid inductor, the second solenoid inductor, and/or the third solenoid inductor as to be described below in FIG. 4. The conductive layers 304.1 through 304.*i* can include various regions, shown using a diagonal shading in FIG. 3, of the one or more non-conductive materials as described above in FIG. 1 to isolate various regions of the one or more regions of the one or more conductive materials from each other. The non-conductive layers 306.1 through 306.*k* include the one or more non-conductive materials to isolate the conductive layers 304.1 through 304.*i* from each other. In some situations, the enclosed IC package 300 can include one or more through silicon via (TSV) structures 308, illustrated using vertical shading in FIG. 3, to electrically connect the enclosed IC package 300 to other electrical, mechanical, and/or electro-mechanical devices. The one or more TSV structures 308 can be used to implement the one or more passive devices, such as first solenoid inductor, the second solenoid inductor, and/or the third solenoid inductor as to be described below in FIG. 4.

As illustrated in FIG. 3, the enclosed IC package 300 further includes an isolation region 310, illustrated using the dark black shading in FIG. 3, situated onto the conductive layer 304.*i*. The isolation region 310 can include the one or more non-conductive materials as described above in FIG. 1. In the exemplary embodiment illustrated in FIG. 3, the isolation region 310 can include one or more regions of conductive material 312, illustrated using a dark dotted shading in FIG. 3, to form electrical connections between the enclosed IC package 300 and other electrical, mechanical, and/or electro-mechanical devices, such as one or more of the SoC packages 106.1 through 106.*n* to provide an example. Moreover, the enclosed IC package 300 includes one or more electrical connections 314 for electrically connecting the enclosed IC package 300 to these other electrical, mechanical, and/or electro-mechanical devices. In the exemplary embodiment illustrated in FIG. 3, the one or more electrical connections 314 represent solder balls, also referred to as solder bumps, for electrically connecting the enclosed IC package 300 to these other electrical, mechanical, and/or electro-mechanical devices, however, other mechanisms are possible for electrically connecting the enclosed IC package 300 to these other electrical, mechanical, and/or electro-mechanical devices as will be recognized by those skilled in the relevant art(s) without departing from the spirit and scope of the present disclosure. In an exemplary embodiment, the one or more electrical connections 314 can be used to implement one or more passive devices, such as first solenoid inductor, the second solenoid inductor, and/or the third solenoid inductor as to be described below in FIG. 4.

Figure 4:
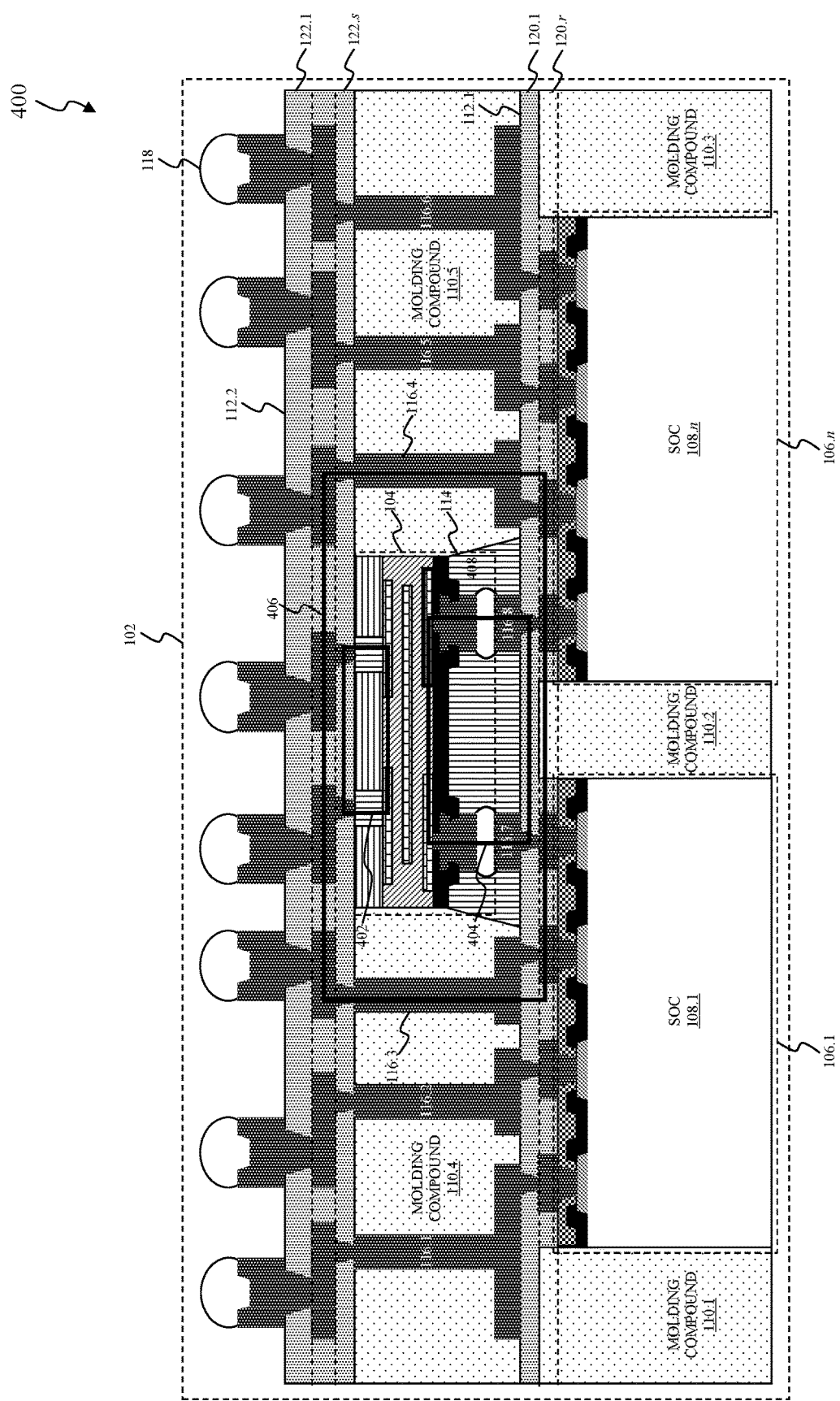
FIG. 4 illustrates various arrangements of conductive material within a cross-sectional diagram of the exemplary multi-chip package that can used to implement one or more solenoid inductors according to an exemplary embodiment of the present disclosure.

Exemplary Solenoid Inductors That Can Be Implemented Within the Exemplary Multi-Chip Package FIG. 4 illustrates various arrangements of conductive material within a cross-sectional diagram of the exemplary multi-chip package that can used to implement one or more solenoid inductors according to an exemplary embodiment of the present disclosure. In a similar manner as described above in FIG. 1, a multi-chip package 400 includes the enclosing IC package 102 mechanically and electrically connected to the enclosed IC package 104. As to be described in further detail below, the enclosing IC package 102 includes one or more electrical interconnections situated between the one or more SoC packages and these other electrical, mechanical, and/or electro-mechanical devices which spread apart as they traverse from the one or more SoC packages to these other electrical, mechanical, and/or electro-mechanical devices. The one or more electrical interconnections can be configured and arranged to form a first solenoid inductor situated within the multi-chip package 400. In some situations as described above, the enclosed IC package 104 can include a second solenoid inductor formed therein. Furthermore, the enclosing IC package 102 package can include a first portion of a third solenoid inductor and the enclosed IC package 104 package can include a second portion of the third solenoid inductor. The enclosed IC package 104 package can be connected to the enclosing IC package 102 to connect the first portion of the third solenoid inductor and the second portion of the third solenoid inductor to form the third solenoid inductor. In the exemplary embodiment illustrated in FIG. 4, a multi-chip package 400 includes a first arrangement 402 of the one or more conductive materials as described above in FIG. 1 within the multi-chip package 400 for implementing the second solenoid inductor, a second arrangement 404 of the one or more conductive materials as described above in FIG. 1 within the multi-chip package 400 for implementing the third solenoid inductor, and a third arrangement 406 of the one or more conductive materials as described above in FIG. 1 within the multi-chip package 400 for implementing the first solenoid inductor.

As illustrated in FIG. 4, the first arrangement 402 can include one or more of the conductive layers 304.1 through 304.*i* of the enclosed IC package 104 as described above in FIG. 3, one or more of the one or more TSV structures 308 of the enclosed IC package 104 as described above in FIG. 3, and one or more the multiple layers 122.1 through 122.*s* of the enclosing IC package 102 as described above in FIG. 1. The second arrangement 404 can include one or more of the conductive layers 304.1 through 304.*i* of the enclosed IC package 104 as described above in FIG. 3, one or more of the one or more regions of conductive material 312 of the enclosed IC package 104 as described above in FIG. 3, one or more of the one or more electrical connections 314 of the enclosed IC package 104 as described above in FIG. 3, one or more of the one or more regions of conductive material 116.1 through 116.8 of the enclosing IC package 102 as described above in FIG. 1, and one or more of the multiple layers 120.1 through 120.*r* of the enclosing IC package 102 as described above in FIG. 1. The third arrangement 406 can include one or more the multiple layers 122.1 through 122.*s* of the enclosing IC package 102 as described above in FIG. 1, one or more of the one or more regions of conductive material 116.1 through 116.8 of the enclosing IC package 102 as described above in FIG. 1 and one or more of the multiple layers 120.1 through 120.*r* of the enclosing IC package 102 as described above in FIG. 1. As to be described in further detail below in FIG. 5A through 5C, these various regions of multi-chip package 400 can include the one or more conductive materials as described above in FIG. 1. The one or more conductive materials as described above in FIG. 1 can be arranged within these various regions of multi-chip package 400 to implement the first solenoid inductor, the second solenoid inductor, and/or the third solenoid inductor.

In some situations, the SOCs 108.1 through 108.n as illustrated in FIG. 4 can include one or more high-frequency circuits and/or one or more low-frequency circuits. In these situations, the one or more low-frequency circuits, which can be sensitive to electromagnetic interference, can be situated within a first SOC from among the SOCs 108.1 through 108.n, and the one or more high-frequency circuits can be situated within a second SOC from among the SOCs 108.1 through 108.n. For example, as to be described in detail below in FIG. 9, the first solenoid inductor, the second solenoid inductor, and/or the third solenoid inductor can be implemented within a variable resonating circuit whose inductance can be controlled by one or more dynamic inductance control circuits, as to be described in detail below in FIG. 7 and FIG. 8. In this example, the variable resonating circuit can be implemented within the first SOC and the one or more dynamic inductance control circuits can be implemented within the second SOC. This configuration and arrangement of the first SOC and the second SOC substantially avoids high frequency electromagnetic interference from the variable resonating circuit of the first SOC from degrading performance of the one or more dynamic inductance control circuit of the second SOC.

Figure 5A:
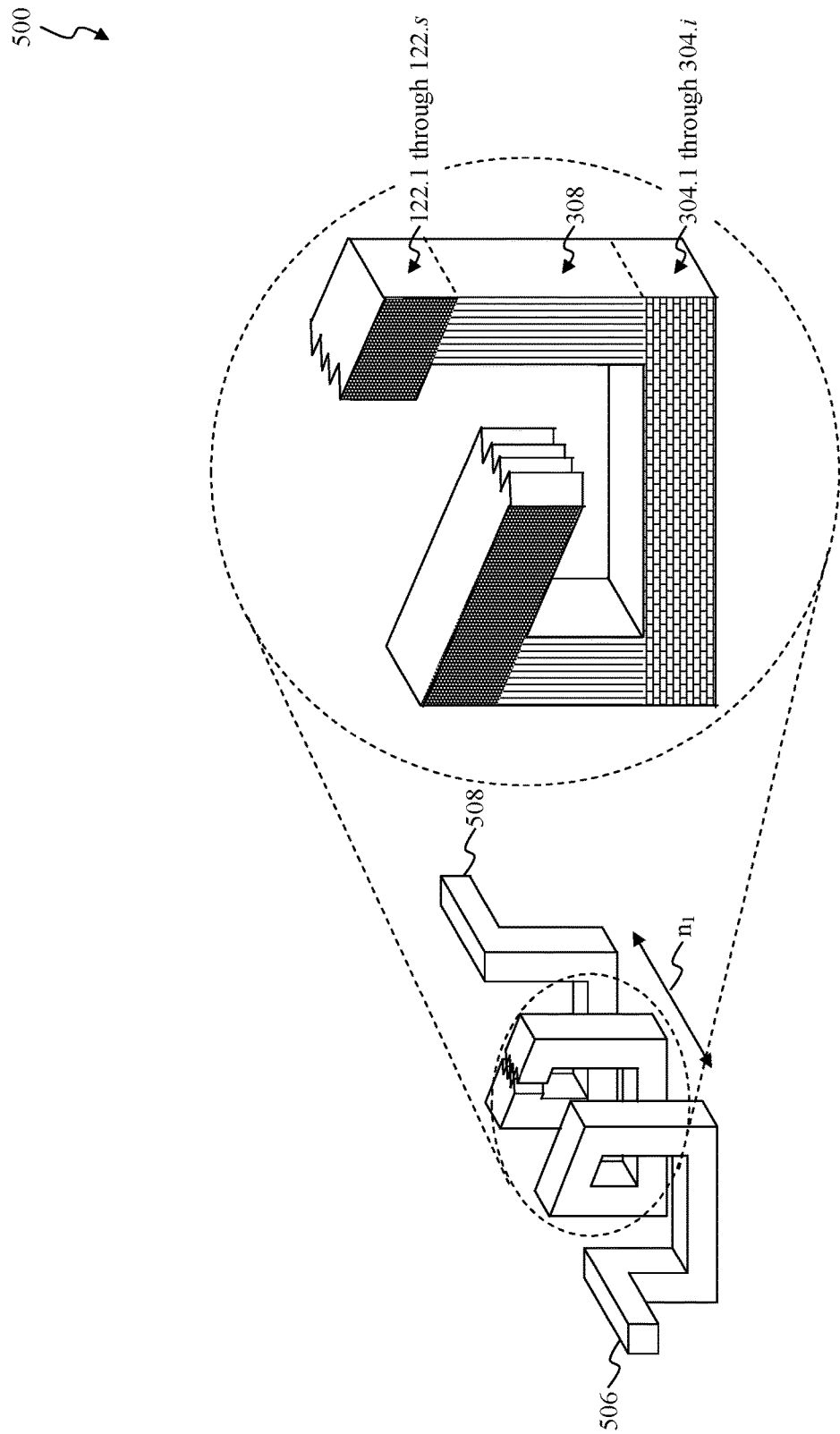
FIG. 5A through FIG. 5C illustrate various exemplary solenoid inductors that can be implemented within the multi-chip package according to an exemplary embodiment of the present disclosure.
Figure 5B:
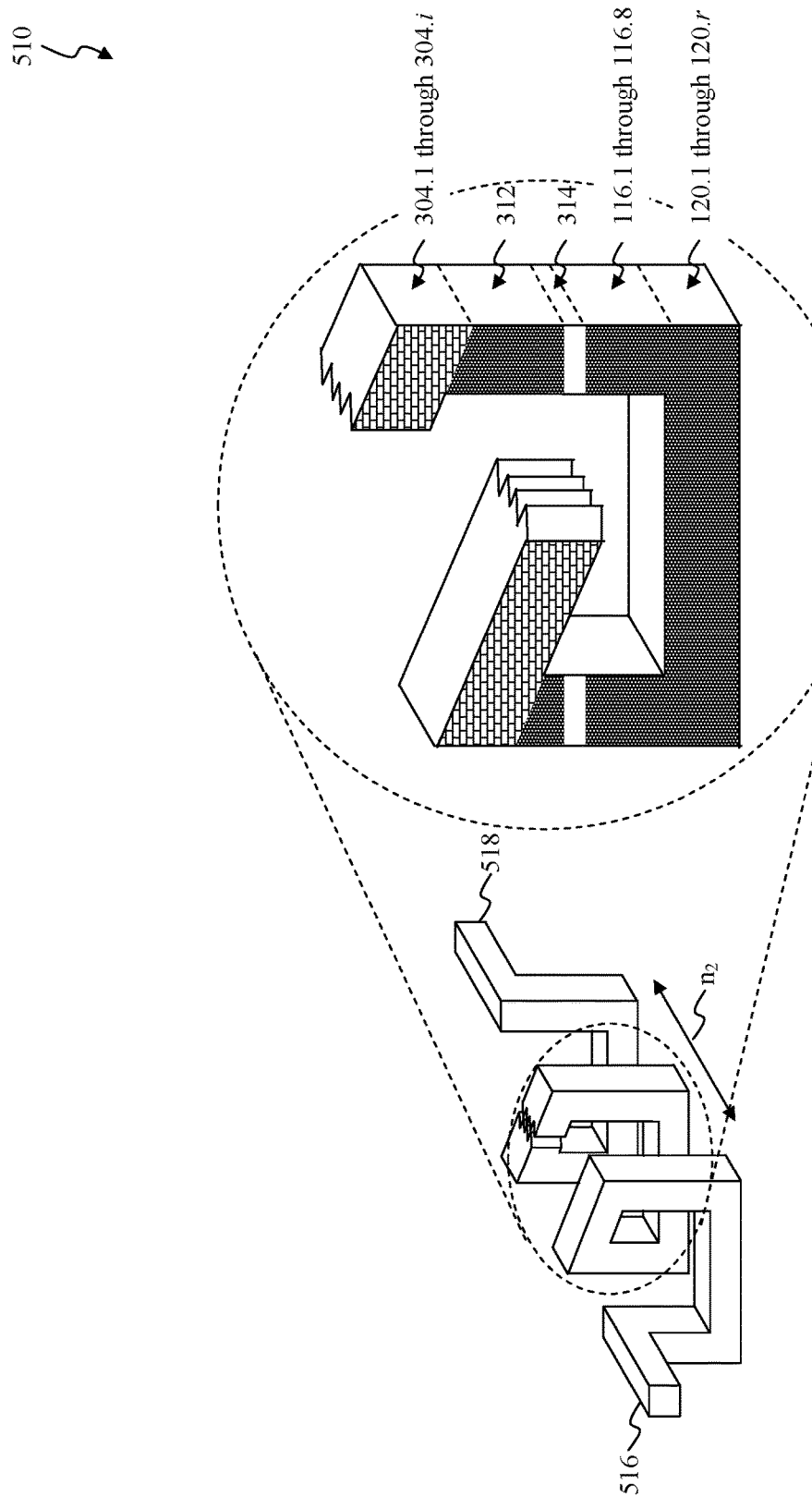
Figure 5C:
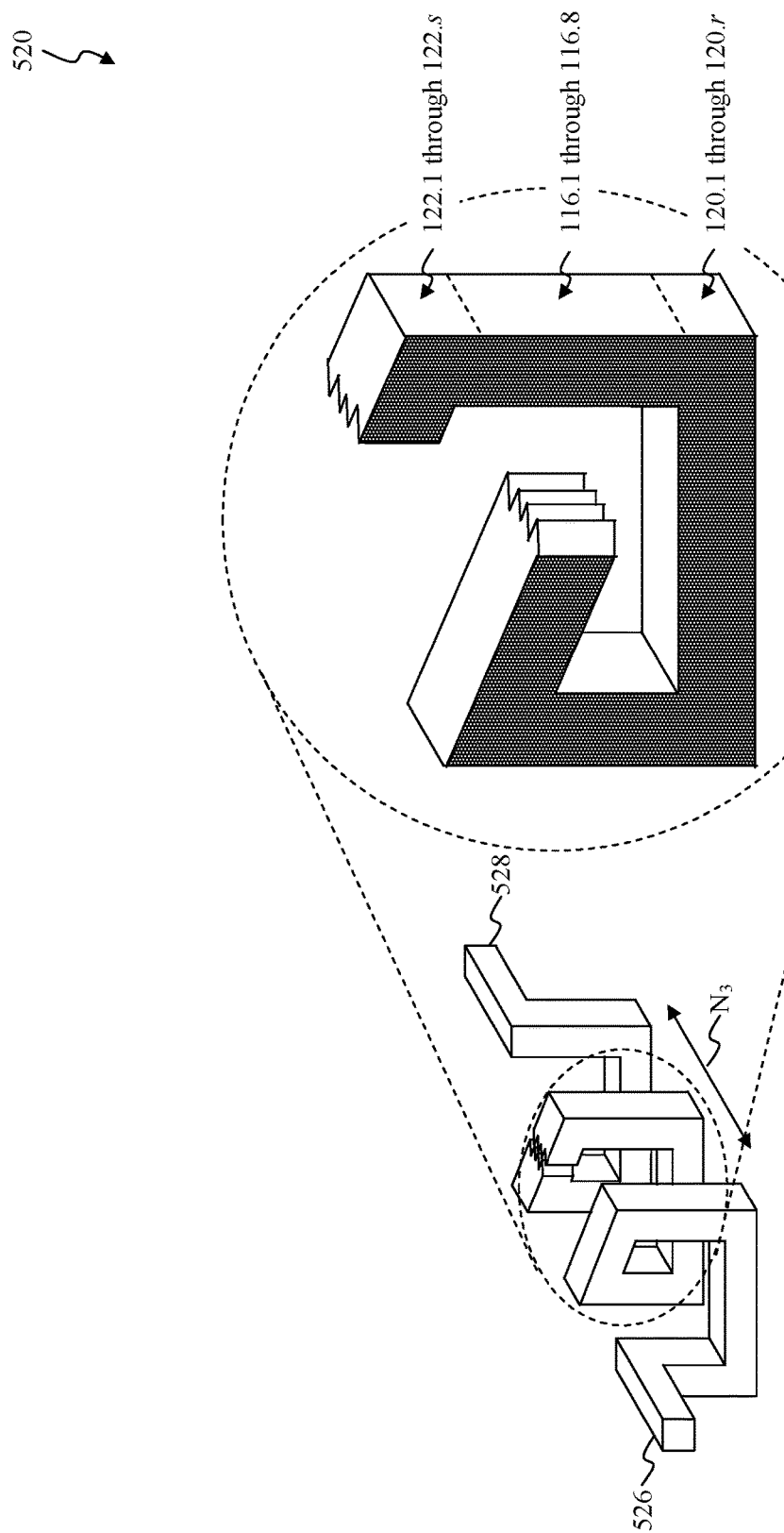

FIG. 5A through FIG. 5C illustrate various exemplary solenoid inductors that can be implemented within the multi-chip package according to an exemplary embodiment of the present disclosure. In the exemplary embodiment illustrated in FIG. 5A through 5C, a multi-chip package, such as the multi-chip package 400 as described above in FIG. 4 to provide an example, can include the one or more conductive materials as described above in FIG. 1 to implement a first solenoid inductor 500, a second solenoid inductor 510, and a third solenoid inductor 520 as illustrated in FIG. 5A, FIG. 5B, and FIG. 5C, respectively. Although the first solenoid inductor 500, the second solenoid inductor 510, and the third solenoid inductor 520 are to be illustrated in FIG. 5A through FIG. 5C as being rectangular prisms, this is for exemplary purposes only. Those skilled in the relevant art(s) will recognize that other configurations and arrangements other than rectangular prisms, such as cylindrical configurations and arrangements to provide an example, are possible without departing from the spirit and scope of the present disclosure.

In the exemplary embodiment illustrated in FIG. 5A, the one or more conductive materials can be implemented within various regions of the multi-chip package, such as the one or more of the conductive layers 304.1 through 304.i of the enclosed IC package 104 as described above in FIG. 3, one or more of the one or more TSV structures 308 of the enclosed IC package 104 as described above in FIG. 3, and one or more the multiple layers 122.1 through 122.s of the enclosing IC package 102 as described above in FIG. 1 to implement the first solenoid inductor 500 having $n_1$ turns rotating in a counter-clockwise direction. Moreover, the $n_1$ turns of the one or more conductive materials terminate to form a first connection port 506 and a second connection port 508 for electrically coupling the first solenoid inductor 500 to other electrical, mechanical, and/or electro-mechanical devices. In the exemplary embodiment illustrated in FIG. 5A, the first connection port 506 and the second connection port 508 represent regions of the one or more conductive materials within the one or more the multiple layers 122.1 through 122.s of the enclosing IC package 102 as described above in FIG. 1.

In the exemplary embodiment illustrated in FIG. 5B, the one or more conductive materials can be implemented within various regions of the multi-chip package, such as the one or more of the conductive layers 304.1 through 304.i of the enclosed IC package 104 as described above in FIG. 3, the one or more of the one or more regions of conductive material 312 of the enclosed IC package 104 as described above in FIG. 3, the one or more of the one or more electrical connections 314 of the enclosed IC package 104 as described above in FIG. 3, the one or more of the one or more regions of conductive material 116.1 through 116.8 of the enclosing IC package 102 as described above in FIG. 1, and the one or more of the multiple layers 120.1 through 120.r of the enclosing IC package 102 as described above in FIG. 1 to implement the second solenoid inductor 510 having $n_2$ turns rotating in the counter-clockwise direction. Moreover, the $n_2$ turns of the one or more conductive materials terminate to form a first connection port 516 and a second connection port 518 for electrically coupling the second solenoid inductor 510 to other electrical, mechanical, and/or electro-mechanical devices. In the exemplary embodiment illustrated in FIG. 5B, the first connection port 516 and the second connection port 518 represent regions of the one or more conductive materials within the one or more of the conductive layers 304.1 through 304.i of the enclosed IC package 104 as described above in FIG. 3.

In the exemplary embodiment illustrated in FIG. 5C, the one or more conductive materials can be implemented within various regions of the multi-chip package, such as the one or more the multiple layers 122.1 through 122.s of the enclosing IC package 102 as described above in FIG. 1, the one or more of the one or more regions of conductive material 116.1 through 116.8 of the enclosing IC package 102 as described above in FIG. 1, and the one or more of the multiple layers 120.1 through 120.r of the enclosing IC package 102 as described above in FIG. 1 to implement the third solenoid inductor 520 having $n_3$ turns rotating in the counter-clockwise direction. Moreover, the $n_3$ turns of the one or more conductive materials terminate to form a first connection port 526 and a second connection port 528 for electrically coupling the third solenoid inductor 520 to other electrical, mechanical, and/or electro-mechanical devices. In the exemplary embodiment illustrated in FIG. 5C, the first connection port 526 and the second connection port 528 represent regions of the one or more conductive materials within the one or more the multiple layers 122.1 through 122.s of the enclosing IC package 102.

Exemplary Operation of the Solenoid Inductors

Figure 6B:
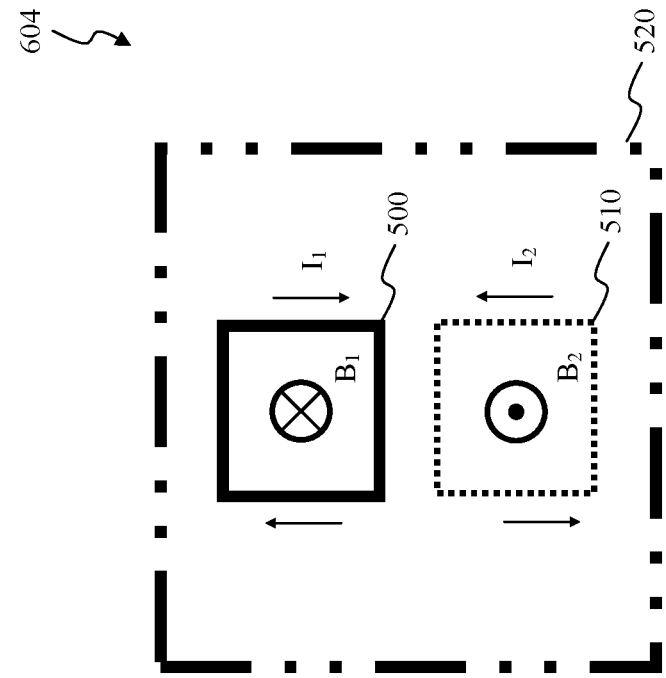
FIGS. 6A and 6B illustrates various exemplary operations of the various exemplary solenoid inductors according to an exemplary embodiment of the present disclosure.
Figure 6A:
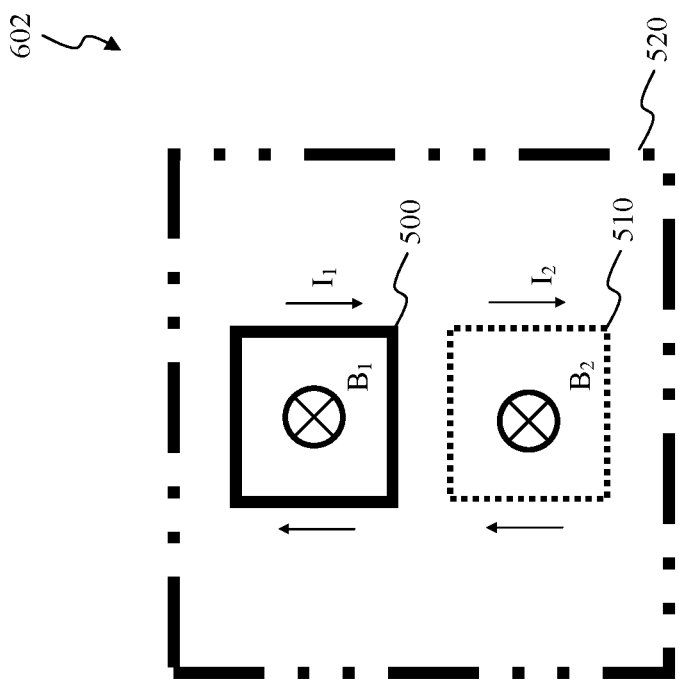

FIGS. 6A and 6B illustrates various exemplary operations of the various exemplary solenoid inductors according to an exemplary embodiment of the present disclosure. Specifically, FIG. 6A and FIG. 6B illustrate exemplary cross-sections 602 and 604, respectively, of one or more solenoid inductors implemented within a multi-chip package, such the multi-chip package as described above in FIG. 4 to provide an example. In the exemplary embodiments illustrated in FIGS. 6A and 6B, an inductance (I) of the third solenoid inductor 520 is proportional to a magnetic field $B_1$ coupling from the first solenoid inductor 500 and a magnetic field $B_2$ coupling from the second solenoid inductor 510. In the exemplary embodiment illustrated in FIG. 6A, when a first current $I_1$ traverses the first solenoid inductor 500 in a clockwise direction, the magnetic field $B_1$ can be characterized as flowing into the exemplary cross-section 602 as shown by a circled "x" in FIG. 6A. Similarly, when a second current $I_2$ traverses the second solenoid inductor 510 in the clockwise direction, the magnetic field $B_2$ can be characterized as flowing into the exemplary cross-section 602 as shown by the circled "x" in FIG. 6A. As a result, the magnetic field $B_1$ and the magnetic field $B_2$ can be characterized as being constructive, namely additive, in nature. Ideally, a magnetic field $B_3$ of the third solenoid inductor 520 can be represented as:

$$B_3 = k_1 B_1 + k_2 B_2, \quad (1)$$

where $B_3$ represents the magnetic field of the third solenoid inductor 520, $B_2$ represents the magnetic field of the second solenoid inductor 510, $B_1$ represents the magnetic field of the first solenoid inductor 510, and k1 and k2 represent coupling factors associated with the first solenoid inductor 510 and the second solenoid inductor 520, respectively.

In the exemplary embodiment illustrated in FIG. 6B, when the first current $I_1$ traverses the first solenoid inductor 500 in the clockwise direction, the magnetic field $B_1$ can be characterized as flowing into the exemplary cross-section 604 as shown by the circled "x" in FIG. 6A. However, when the second current $I_2$ traverses the second solenoid inductor 510 in a counter-clockwise direction, the magnetic field $B_2$ can be characterized as flowing out of the exemplary cross-section 604 as shown by the dotted "x" in FIG. 6A. As a result, the magnetic field $B_1$ and the magnetic field $B_2$ can be characterized as being destructive, namely subtractive, in nature. Ideally, a magnetic field $B_3$ of the third solenoid inductor 520 can be represented as:

$$B_3 = k_1 B_1 - k_2 B_2 \quad (2)$$

where $B_3$ represents the magnetic field of the third solenoid inductor 520, $B_2$ represents the magnetic field of the second solenoid inductor 510, $B_1$ represents the magnetic field of the first solenoid inductor 510, and k1 and k2 represent coupling factors associated with the first solenoid inductor 510 and the second solenoid inductor 520, respectively. As illustrated by Equation (1) and Equation (2), the magnetic field $B_3$ of the third solenoid inductor 520, and hence the inductance of the third solenoid inductor 520, can be varied by selectively controlling the magnetic field $B_1$ of the first solenoid inductor 510 and the magnetic field $B_2$ of the second solenoid inductor 520

Figure 7:
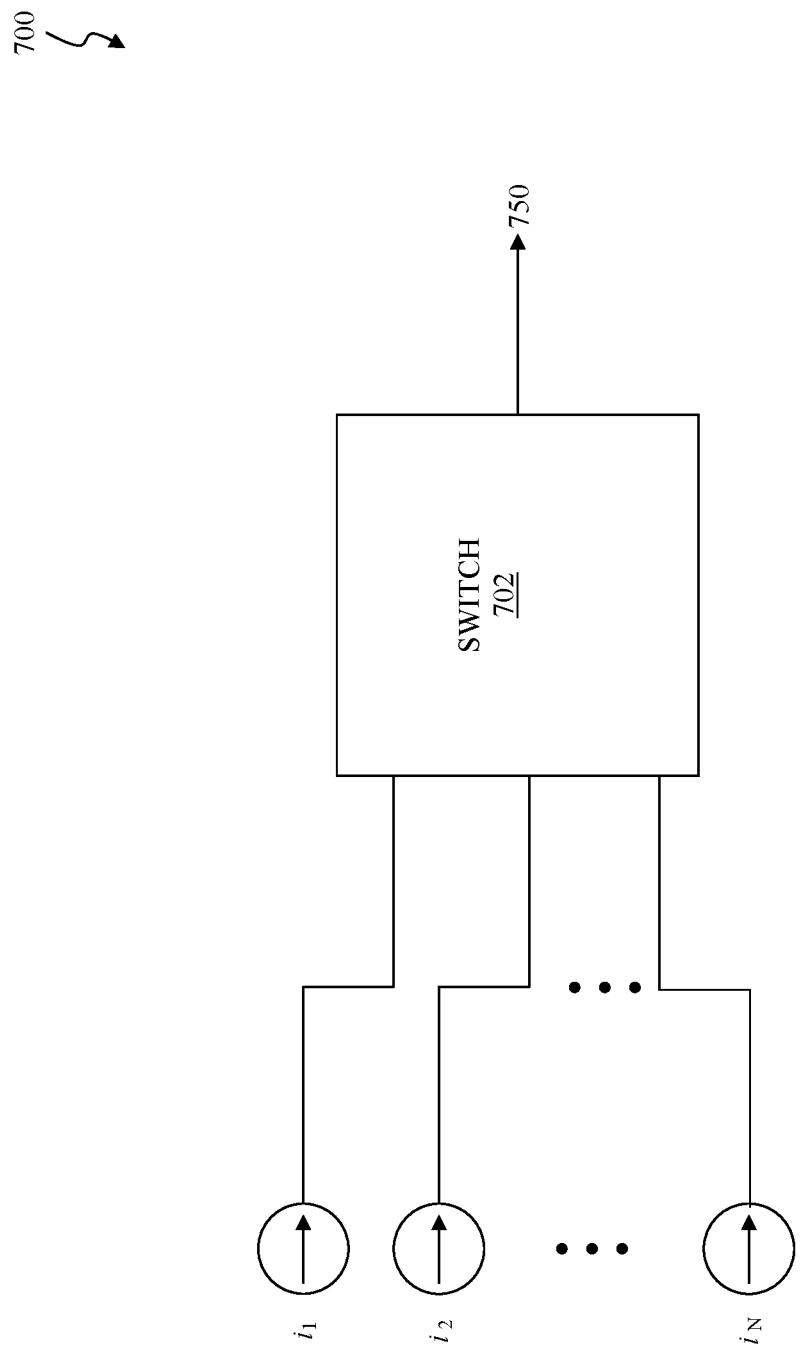
FIG. 7 illustrates a block diagram of a first exemplary System on Chip (SoC) package that can be implemented within the multi-chip package to dynamically control inductance of the various exemplary solenoid inductors according to an exemplary embodiment of the present disclosure.

FIG. 7 illustrates a block diagram of a first exemplary System on Chip (SoC) package that can be implemented within the multi-chip package to dynamically control inductance of the various exemplary solenoid inductors according to an exemplary embodiment of the present disclosure. As described above in FIG. 6A and FIG. 6B, the magnetic field $B_3$ of the third solenoid inductor 520, and hence the inductance of the third solenoid inductor 520, can be selectively varied in accordance with the first current $I_1$ of the first solenoid inductor 500 and the second current $I_2$ of the second solenoid inductor 510. As illustrated in FIG. 7, a dynamic inductance control circuit 700 can dynamically generate a control current 750 by selecting one or more current sources from among current sources $i_1$ through $i_N$. In an exemplary embodiment, the control current 750 can represent an exemplary embodiment of the first current $I_1$ as illustrated in FIG. 6A and FIG. 6B and/or the second current $I_2$ as illustrated in FIG. 6A and FIG. 6B. In the exemplary embodiment illustrated in FIG. 7, the dynamic inductance control circuit 700 can be implemented within one of the System on Chip (SoC) packages 106.1 through 106.n as described above in FIG. 1. In this exemplary embodiment, the control current 750 can be applied to the second connection port 508 of the first solenoid inductor 500 as illustrated in FIG. 5A and/or to the second connection port 518 of the second solenoid inductor 510 as illustrated in FIG. 5B to cause the control current 750 to traverse through the first solenoid inductor 500 and/or the second solenoid inductor 510 in the clockwise direction as described above in FIG. 6A and FIG. 6B. Moreover, in this exemplary embodiment, the control current 750 can be applied to the first connection port 506 of the first solenoid inductor 500 as illustrated in FIG. 5A and/or to the first connection port 516 of the second solenoid inductor 510 as illustrated in FIG. 5B to cause the control current 750 to traverse through the first solenoid inductor 500 and/or the second solenoid inductor 510 in the counter-clockwise direction as described above in FIG. 6A and FIG. 6B. Alternatively, the control current 750 can be applied to the first connection port 506 of the first solenoid inductor 500 as illustrated in FIG. 5A and/or to the first connection port 516 of the second solenoid inductor 510 as illustrated in FIG. 5B to cause the control current 750 to traverse through the first solenoid inductor 500 and/or the second solenoid inductor 510 in the counter-clockwise direction as described above in FIG. 6A and FIG. 6B. Otherwise, the control current 750 can be applied to the second connection port 508 of the first solenoid inductor 500 as illustrated in FIG. 5A and/or to the second connection port 518 of the second solenoid inductor 510 as illustrated in FIG. 5B to cause the control current 750 to traverse through the first solenoid inductor 500 and/or the second solenoid inductor 510 in the clockwise direction. In some situations, the multi-chip package can include multiple dynamic inductance control circuits 700 within one or more System on Chip (SoC) packages, such as one or more of the System on Chip (SoC) packages 106.1 through 106.n as described above in FIG. 1.

In the exemplary embodiment illustrated in FIG. 7, the dynamic inductance control circuit 700 includes the current sources $i_1$ through $i_N$ and a switch 702. In an exemplary embodiment, the current sources $i_1$ through $i_N$ can represent statically fixed current sources outputting approximately equal currents; however, the current sources $i_1$ through $i_N$ can generate other distributions of currents, for example, a binary distribution of currents, as will be recognized by those skilled in the relevant art(s) without departing from the spirit and scope of the present disclosure. In another exemplary embodiment, the current sources $i_1$ through $i_N$ can represent dynamically variable current sources. In this other exemplary embodiment, these dynamically variable current sources can dynamically vary and/or control phases and/or magnitudes of currents being outputted. These dynamically variable current sources can be selectively configured to achieve different magnetic fields for the third solenoid inductor 520 as described above in FIG. 6A and FIG. 6B. For example, as described above, the multi-chip package can include multiple dynamic inductance control circuits 700, each of these multiple dynamic inductance control circuits 700 generate corresponding control currents 750. In this example, the control current 750 corresponding to a first dynamic inductance control circuit 700, for example, the second current $I_2$ as described above in FIGS. 6A and 6B, can be selectively adjusted to be out-of-phase with the control current 750 corresponding to a second dynamic inductance control circuit 700, for example, the first current $I_1$ as described above in FIGS. 6A and 6B, to decrease the magnetic field, and hence the inductance, for the third solenoid inductor 520. Also, in this example, the control current 750 corresponding to a first dynamic inductance control circuit 700, for example, the second current $I_2$ as described above in FIGS. 6A and 6B, can be selectively adjusted to be in-phase with the control current 750 corresponding to a second dynamic inductance control circuit 700, for example, the first current $I_1$ as described above in FIGS. 6A and 6B, to increase the magnetic field, and hence the inductance, for the third solenoid inductor 520. In the exemplary embodiment illustrated in FIG. 7, the switch 702 selectively chooses one or more of the current sources $i_1$ through $i_N$ to provide the control current 750. In an exemplary embodiment, the switch 702 can be implemented as a multiplexing circuit to selectively choose one of the current sources $i_1$ through $i_N$ to provide the control current 750, however, more complicated configurations and arrangements for the switch 702 are possible for selectively choose one or more of the current sources $i_1$ through $i_N$ as will be recognized by those skilled in the relevant art(s) without departing from the spirit and scope of the present disclosure.

Figure 8:
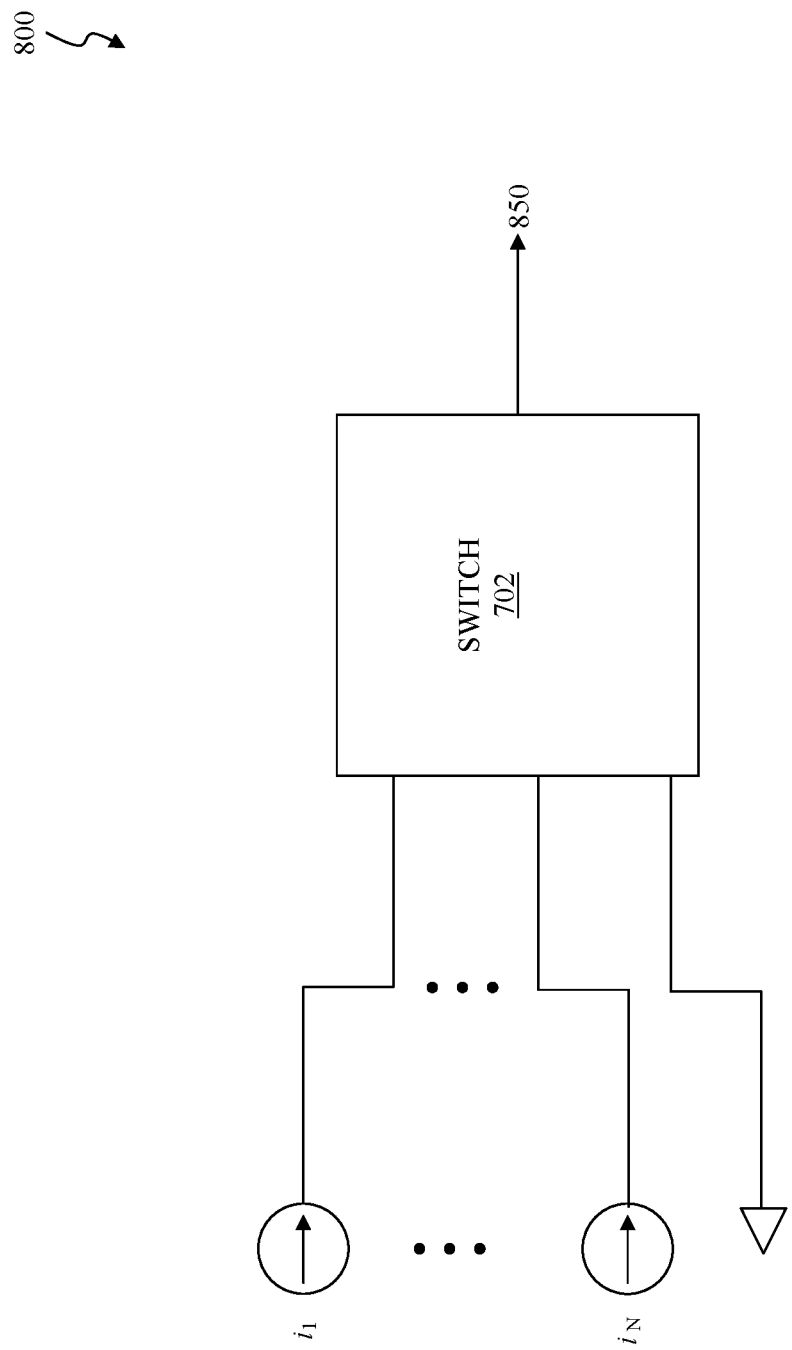
FIG. 8 illustrates a block diagram of a second exemplary System on Chip (SoC) package that can be implemented within the multi-chip package to dynamically control inductance of the various exemplary solenoid inductors according to an exemplary embodiment of the present disclosure.

FIG. 8 illustrates a block diagram of a second exemplary System on Chip (SoC) package that can be implemented within the multi-chip package to dynamically control inductance of the various exemplary solenoid inductors according to an exemplary embodiment of the present disclosure. As described above in FIG. 6A and FIG. 6B, the magnetic field $B_3$ of the third solenoid inductor 520, and hence the inductance of the third solenoid inductor 520, can be selectively varied in accordance with the first current $I_1$ of the first solenoid inductor 500 and the second current $I_2$ of the second solenoid inductor 510. As illustrated in FIG. 8, a dynamic inductance control circuit 800 can dynamically generate a control current 850 by selecting one or more current sources from among current sources $i_1$ through $i_N$ in a substantially similar manner as described above in FIG. 7. In some situations, the switch 702 as illustrated in FIG. 8 can dynamically select a ground potential, or other suitable potential that will be recognized by those skilled in the relevant art(s), to effectively disable the first solenoid inductor 500 or the second solenoid inductor 510.

Furthermore, in a substantially similar manner as described above in FIG. 7, the control current 850 can be applied to the second connection port 508 of the first solenoid inductor 500 as illustrated in FIG. 5A and/or to the second connection port 518 of the second solenoid inductor 510 as illustrated in FIG. 5B to cause the control current 850 to traverse through the first solenoid inductor 500 and/or the second solenoid inductor 510 in the clockwise direction as described above in FIG. 6A and FIG. 6B. Moreover, in this exemplary embodiment, the control current 850 can be applied to the first connection port 506 of the first solenoid inductor 500 as illustrated in FIG. 5A and/or to the first connection port 516 of the second solenoid inductor 510 as illustrated in FIG. 5B to cause the control current 850 to traverse through the first solenoid inductor 500 and/or the second solenoid inductor 510 in the counter-clockwise direction as described above in FIG. 6A and FIG. 6B. Alternatively, the control current 850 can be applied to the first connection port 506 of the first solenoid inductor 500 as illustrated in FIG. 5A and/or to the first connection port 516 of the second solenoid inductor 510 as illustrated in FIG. 5B to cause the control current 850 to traverse through the first solenoid inductor 500 and/or the second solenoid inductor 510 in the counter-clockwise direction as described above in FIG. 6A and FIG. 6B. Otherwise, the control current 850 can be applied to the second connection port 508 of the first solenoid inductor 500 as illustrated in FIG. 5A and/or to the second connection port 518 of the second solenoid inductor 510 as illustrated in FIG. 5B to cause the control current 850 to traverse through the first solenoid inductor 500 and/or the second solenoid inductor 510 in the clockwise direction as described above in FIG. 6A and FIG. 6B.

Exemplary Application for the Exemplary Solenoid Inductors

Figure 9:
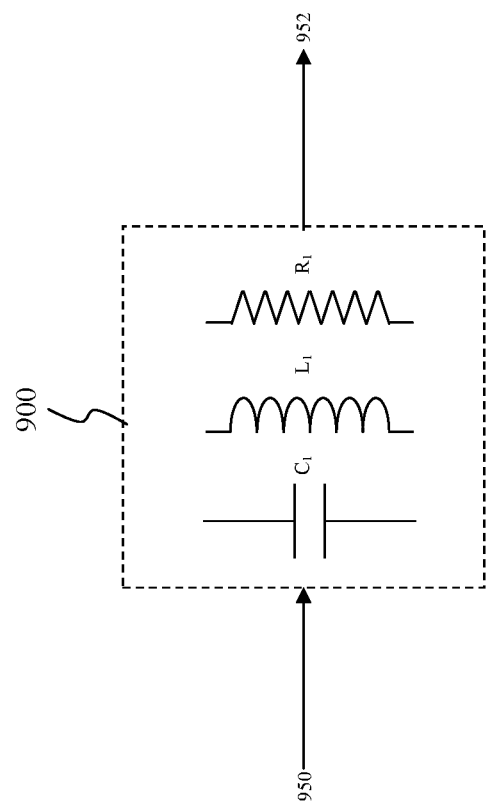
FIG. 9 illustrates a block diagram of a variable resonating circuit that can be implemented within the multi-chip package according to an exemplary embodiment of the present disclosure.

FIG. 9 illustrates a block diagram of a variable resonating circuit that can be implemented within the multi-chip package according to an exemplary embodiment of the present disclosure. In the exemplary embodiment illustrated in FIG. 9, a variable resonating circuit 900 operates on an electronic input signal 950 to provide an electronic output signal 952. The variable resonating circuit 900 can be implemented as part of a variable frequency oscillator, a variable band-pass filter, a variable band-stop filter, a variable low-pass filter, a variable high-pass filter, and/or any other suitable implementation that will be apparent to those skilled in the relevant art(s) without departing from the spirit and scope of the present disclosure. As illustrated in FIG. 9, the variable resonating circuit 900 can include one or more capacitances $C_1$, one or more resistances $R_1$, and/or one or more variable inductances $L_1$. In some situations, the variable resonating circuit 900 need not include the one or more capacitances $C_1$, the one or more resistances $R_1$, and/or the one or more variable inductances $L_1$. For example, the variable resonating circuit 900 can include the one or more capacitances $C_1$ and the one or more variable inductances $L_1$ to form a variable L-C resonant circuit.

The one or more capacitances $C_1$, the one or more resistances $R_1$, and/or the one or more variable inductances $L_1$ can be implemented in a parallel configuration, a series configuration, or any combination of the parallel configuration and the series configuration that will be apparent to those skilled in the relevant art(s) without departing from the spirit and scope of the present disclosure. For example, the one or more capacitances $C_1$, the one or more resistances $R_1$, and/or the one or more variable inductances $L_1$ can be implemented in the series configuration to form a variable RLC series resonant circuit. As another example, the one or more capacitances $C_1$, the one or more resistances $R_1$, and/or the one or more variable inductances $L_1$ can be implemented in the parallel configuration to form a variable RLC parallel resonant circuit. As a further example, the one or more resistances $R_1$, and/or the one or more variable inductances $L_1$ can be implemented in the series configuration with the one or more capacitances $C_1$ being in the parallel configuration in relation to this series configuration. In the exemplary embodiment illustrated in FIG. 9, the one or more capacitances $C_1$ and the one or more resistances $R_1$ are implemented within one or more System on Chip (SoC) packages of a multi-chip package, such as one or more of the SoC packages 106.1 through 106.n as described above in FIG. 1. In this exemplary embodiment, the one or more variable inductances $L_1$ can represent exemplary embodiments of one or more of the first solenoid inductor 500 as described above in FIG. 5A, the second solenoid inductor 510 as described above in FIG. 5B, and/or the third solenoid inductor 520 as described above in FIG. 5C. As such, the one or more variable inductances $L_1$ can be implemented within an enclosing IC package of the multi-chip package, such as the enclosing IC package 102 as described above in FIG. 1 to provide an example and/or an enclosed IC package of the multi-chip package, such as the enclosed IC package 104 as described above in FIG. 1 to provide an example.

In an exemplary embodiment, a resonant frequency $\omega_o$ of the variable resonating circuit 900 can be approximated as:

$$\omega_o = \frac{1}{\sqrt{LC}}, \tag{3}$$

where $\omega_o$ represents the resonant frequency of the variable resonating circuit 900, L represents an inductance of the one or more variable inductances $L_1$, and C represents a capacitance of the one or more capacitances $C_1$. As described above in FIG. 5A through FIG. 8, the inductance of the first solenoid inductor 500 as described above in FIG. 5A, inductances of the second solenoid inductor 510 as described above in FIG. 5B, and/or the third solenoid inductor 520 as described above in FIG. 5B, and hence, the one or more variable inductances $L_1$, can be selectively varied. A range of the resonant frequency $\omega_o$ can be approximated as:

$$\frac{1}{\sqrt{L_{MAX}C}} \leq \omega_o \leq \frac{1}{\sqrt{L_{MIN}C}}, \quad (4)$$

where $L_{MIN}$ represents a minimum inductance of the one or more variable inductances $L_1$ and $L_{MAX}$ represents a maximum inductance of the one or more variable inductances $L_1$. And in some situations, capacitances of the one or more capacitances $C_1$ can also be varied. In these situations, a range of the resonant frequency $\omega_o$ can be approximated as:

$$\frac{1}{\sqrt{L_{MAX}C_{MAX}}} \leq \omega_o \leq \frac{1}{\sqrt{L_{MIN}C_{MIN}}}, \quad (5)$$

where $C_{MIN}$ represents a minimum capacitance of the one or more capacitances $C_1$ and $C_{MAX}$ represents a maximum capacitance of the one or more capacitances $C_1$.

Exemplary Fabrication of the Exemplary
Multi-Chip Package

Figure 10:
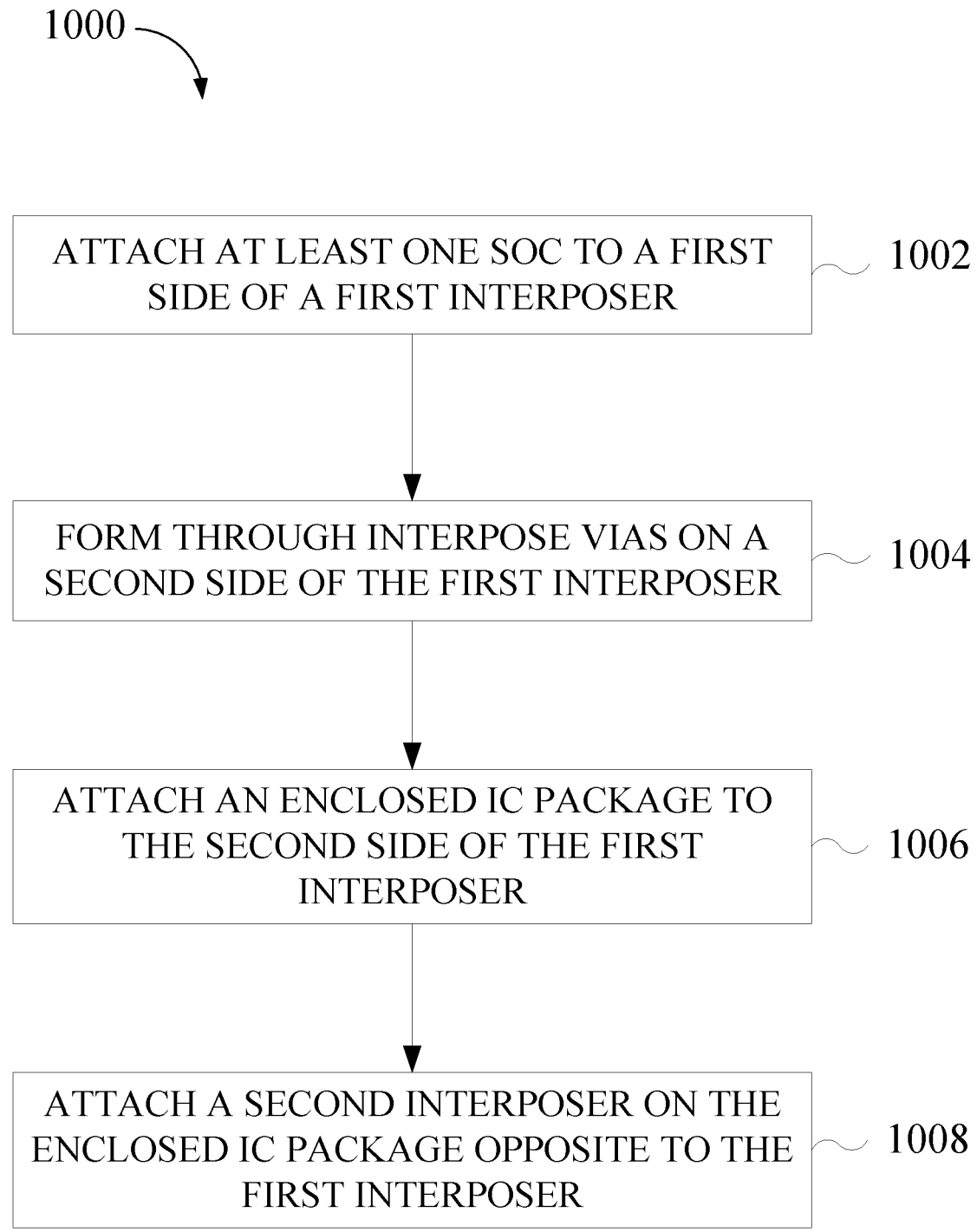
FIG. 10 illustrates a flowchart of exemplary operations for fabricating the exemplary multi-chip package according to an exemplary embodiment of the present disclosure.

FIG. 10 illustrates a flowchart of exemplary operations for fabricating the exemplary multi-chip package according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes an exemplary operational control flow 1000 for fabricating a multi-chip package, such as the multi-chip package 400 to provide an example. As to be described below, the exemplary operational control flow 1000 represents a multiple-operation sequence that includes, but is not limited to, alignment operations, implant operations (e.g., doping), photolithography and etching operations (e.g., patterning), material deposition (metal deposition, dielectric deposition, spin-on coating of organic or inorganic materials, etc.), thermal or other type of treatments to cure or activate layers, and layer planarization (e.g., chemical mechanical planarization, drying etching, etc.) for gradually creating the multi-chip package. In some embodiments, the components of the multi-chip package are formed independently form each other and subsequently bonded together to form the multi-chip package.

At operation 1002, the exemplary operational control flow 1000 forms at least one SOC to a first side of a first interposer, such as the first interposer 112.1 shown in FIG. 1 of multi-chip package 400. In some embodiments, the SOC combines various electronic components into a single integrated circuit (IC). These individual components are not shown in FIGS. 1 and 4 for simplicity. By way of example and not limitation, an SOC can include arrays of transistors, resistors, capacitors, and other active or passive electronic components, which are interconnected through a metallization network of contacts, vias, and lines. In some embodiments, the SOC includes front end of the line (FEOL), middle of the line (MOL), and back end of the line layers (BEOL), which are formed sequentially over a substrate (e.g., a carrier wafer)—also not shown in FIGS. 1 and 4. As mentioned above, the SOC can be formed independently form the other components of the multi-chip package like the first interposer, the second interposer, and the enclosed package. For example, the SOC can be formed on a carrier (e.g., a semiconductor wafer) via standard IC fabrication methods, and then be attached to a first side of the first interposer of the multi-chip package. In order to attach the SOC to the first side of the first interposed, the side of the SOC that is opposite to its carrier is fitted with I/O ports 204, which are insulated by isolation regions 206 and protected by encapsulation material 208 as shown in FIG. 2. Formation of I/O ports 204 can be achieved, for example, with metal layer deposition and subsequent patterning of the deposited metal (e.g., using photolithography and etching) to form I/O ports 204. Once I/O ports are formed, isolation regions 206 can be formed in a similar fashion—e.g., isolation material deposition and subsequent patterning to expose I/O ports 204. Similarly, encapsulation material 208 can be deposited and pattern to expose a portion of I/O ports 204. Depending on the integration scheme, a conductive material can be deposited directly on I/O ports 204 and be subsequently planarized or etched back so that a top surface of the conductive material becomes co-planar with a top surface of encapsulation material 208. It is noted that I/O ports 204 are coupled electrically with the electrical components inside the SOC and are responsible for transferring electrical signals in and out of the SOC for power and communication purposes.

By way of example and not limitation, first interposer 112.1 of the multi-chip package 100 (e.g., shown in FIGS. 1 and 4) can be formed initially on a carrier substrate (e.g., a glass carrier substrate) that will be subsequently removed. By way of example and not limitation, the carrier substrate will end up on a second side of the first interposer, which is opposite to the first side of the first interposer where the SOC will be attached. For example, the interposer can be initially formed on a carrier substrate not shown in FIGS. 1 and 4. The interposer can include a network of redistribution layers (RDL) that provide electrical connections to I/O ports 204 (e.g., shown in FIG. 2) of SOC 202 and to non-conductive platform 114 and enclosed IC package 104 (e.g., shown in FIGS. 1 and 4) that will be attached on the second side of the first interposer once the carrier substrate is removed. Referring to FIGS. 1 and 4, the aforementioned redistribution layer of first interposer 112.1 can be 116.9, according to some embodiments. By way of example and not imitation, the conductive structures in RDL 116.9 can be formed by metal deposition and patterning using photolithography and etching operations. In some embodiments, first interposer 112.1 can include polyimide (PI) or a polybenzoxazole (PBO) material to isolate the conductive structures in RDL 116.9 and provide mechanical support to first interposer 112.1 after the removal of the carrier substrate.

The SOC can be then attached to the first interposer, so that I/O ports 204 of the SOC are aligned and connected to respective conductive lines of RDL 116.9 of the first side of first interposer 112.1. In some embodiments, multiple SOC (e.g., dies) can be attached on the first side of first interposer 112.1. Subsequently, a molding compound can be spin-coated over the SOC attached on the first side of first interposer 112.1 to fill the space between adjacent SOC (e.g., between SOC 108.1 and 108.n in FIGS. 1 and 4). According to some embodiments, the molding compound is an epoxy-based material that is a solid at room temperature and a liquid when heated at temperatures greater than 180° C. (e.g., between about 180° C. and about 200° C.). In some embodiments, the molding compound is melted before being spin-coated on first interposer 112.1. According to some embodiments, the SOC become embedded in the molding compound.

After its application, the molding compound is left to cool and harden. Once the molding compound hardens, it can be partially grinded and/or polished with a chemical mechanical planarization (CMP) process until the top surfaces of the SOC is exposed. In some embodiments, the molding compound provides structural support to multi-chip package 100. Once the molding is polished, the carrier substrate can be removed from the second side of first interposer 112.1. This allows additional connections to be made to the second side of first interposer 112.1. For example, it allows additional components of multi-chip package to be attached to the second side of first interposer 112.1 opposite to SOC 108.1 and 108.n. In some embodiments, another RDL is formed on the second side of first interposer 112.1 to facilitate the electrical and mechanical connections to enclosed IC package 104.

In operation 1004 of the exemplary operational control flow 1000, through interpose vias (TIVs) are formed on the second side of first interposer 112.1. By way of example and not limitation, the TIVs can be formed using photolithography and etching operations (e.g., patterning). For example, a photoresist layer can be spin-coated over the RDL of the second side of first interposer 112.1. The photoresist can be patterned to form TSV openings that expose respective conductive structures of the RDL. A conductive material is then deposited and/or electroplated into the opening to form the TSVs. The conductive material can be a stack of materials, such as a seed layer that coats the bottom and sidewall surfaces of the openings and a core metal that fills the openings. In some embodiments, the as-deposited conductive material grows over the photoresist. A CMP or an etch-back process can be used to remove excess conductive material from a top surface of the photoresist. After the formation of the TSVs (e.g., conductive structures 116.1-116.6), the photoresist layer can be removed with a wet etching process that leaves the TSVs free standing.

In operation 1006 of the exemplary operational control flow 1000, an enclosed IC package, like enclosed IC package 104, is attached to a second side of first interposer 112.1. In some embodiments, a first portion of non-conductive platform 114 can be formed on enclosed IC package 104 over isolation region 310 to surround conductive material 312 (UBM). Accordingly, a second portion of non-conductive platform 114 can be formed on the second side of first interposer 112.1 to surround conductive structures 116.7 and 116.8 of the RDL layer. Therefore, when enclosed IC package 104 is attached to first interposer 112.1, electrical connections 314 are aligned to conductive structures 116.7 and 116.8 of first interposer 112.1 and the first and second portions of non-conductive platform 114 come together.

Once enclosed IC package 104 is attached, a molding compound is formed similarly to the molding compound formed on the first side of first interposer 112.1 discussed earlier. For example, a molding compound can be spin-coated over the TSVs, non-conductive platform 114, and enclosed IC package 104—which become embedded into the molding compound. After its application, the molding compound is left to cool and harden. Once the molding compound hardens, it can be partially grinded and/or polished with a CMP process until the top surfaces the TSVs and enclosed IC package 104 are exposed.

In operation 1008 of the exemplary operational control flow 1000, a second interposer (e.g., second interposer 112.2) can be attached to enclosed IC package 104. The second interposer can be formed using similar operations described for first interposer 112.1. However, the RDLs formed on the second interposer will have to be adjusted to facilitate connections to the TIVs in the molding compound and to TSV structures 308 of enclosed IC package 104. In some embodiments, second interposer 112.2 can feature under bump metallurgy (UBM) structures and solder bumps on a side that is opposite to enclosed IC package 104, as shown in FIGS. 1 and 4.

In some embodiments, multi-chip package can be assembled such that elements of multi-chip package when bonded together form a first arrangement 402, a second arrangement 404, and a third arrangement 406, according to FIG. 4. For example, first arrangement 402 can be formed by conductive structures in the RDL of second interposer 112.2, TSVs 308 of enclosed IC package 104, and a portion of conductive layer 304.1 of enclosed IC package 104. Second arrangement can be formed by using a portion of the conductive layer 304.i of enclosed IC package 104, conductive material 312 and electrical connections 314, and conductive structures 116.7/116.8 of the RDL on the second side of first interposer 112.1. Finally, third arrangement 406 can be formed by respective conductive structures in the RDLs of the first and second interposers (e.g., 112.1 and 112.2) and TIVs of the conductive material 116.4.

CONCLUSION

The foregoing Detailed Description discloses a multi-chip package including an exemplary enclosed IC package and an enclosing IC package. The enclosed IC package includes first conductive layers disposed onto a semiconductor substrate, the first conductive layers including a first portion of a first solenoid inductor and a first portion of a second solenoid inductor. The semiconductor substrate includes through silicon via (TSV) structures to electrically couple the first portion of the first solenoid inductor and a second portion of the first solenoid inductor. The enclosing IC package includes system on chip (SoC) packages, a first interposer, a second interposer, regions of a molding compound, and regions of conductive material. The first interposer, situated onto the SoC packages, includes second conductive layers, wherein a second portion of the second solenoid inductor and a first portion of a third solenoid inductor are situated within the second conductive layers. The second interposer, situated onto the enclosed IC package, includes third conductive layers, wherein the second portion of the first solenoid inductor and a second portion of a third solenoid inductor are situated within the third conductive layers. The regions of the molding compound are situated between the first interposer and the second interposer and include a plurality via structures to electrically couple the first portion of the third solenoid inductor and the second portion of the third solenoid inductor. The regions of conductive material are situated between the enclosed IC package and the first interposer to electrically couple the first portion of the second solenoid inductor and the second portion of the second solenoid inductor.

The foregoing Detailed Description additionally discloses an exemplary enclosed IC package. The enclosed IC package includes conductive layers disposed onto a semiconductor substrate. The conductive layers include a first portion of a first solenoid inductor and a first portion of a second solenoid inductor. The semiconductor substrate includes a plurality of through silicon via (TSV) structures electrically coupled to the first portion of the first solenoid inductor.

The foregoing Detailed Description further discloses a method for fabricating a multi-chip package. The method includes attaching at least one system on chip (SOC) on a first side of a first interposer. The method additionally includes forming through interpose vias (TIVs) on a second side of the first interposer opposite to the first side, wherein each of the first and second sides of the first interposer comprises a redistribution layer configured to mechanically and electrically connect, respectively, to the at least one SOC and the TIVs. The method also includes attaching an enclosed integrated circuit package to the second side of the first interposer so that a first conductive layer on a first side of the enclosed integrated circuit package is electrically coupled to a first portion of the redistribution layer on the second side of the first interposer, wherein the first conductive layer on a first side of the enclosed integrated circuit package and the first portion of the redistribution layer on the second side of the first interposer form a first solenoid inductor. The method further includes attaching a second interposer on a second side of the enclosed integrated circuit package, opposite to the first side of the enclosed integrated circuit package, so that a second conductive layer on the second side of the enclosed integrated circuit package is electrically coupled to a first portion of an redistribution layer on a first side of the second interposer and a second portion of the redistribution layer on the first side of the second interposer is electrically couple through the TIVs to a second portion of the redistribution layer on the second side of the first interposer, wherein the second conductive layer on the second side of the enclosed integrated circuit package and the first portion of the redistribution layer on the first side of the second interposer form a second solenoid inductor, and wherein the second portion of the redistribution layer on the first side of the second interposer, the TIVs, and the second portion of the redistribution layer on the second side of the first interposer form a third solenoid inductor.

The foregoing Detailed Description referred to accompanying figures to illustrate exemplary embodiments consistent with the disclosure. References in the foregoing Detailed Description to "an exemplary embodiment" indicates that the exemplary embodiment described can include a particular feature, structure, or characteristic, but every exemplary embodiment may not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The foregoing Detailed Description is not meant to limiting. Rather, the scope of the disclosure is defined only in accordance with the following claims and their equivalents. It is to be appreciated that the foregoing Detailed Description, and not the following Abstract section, is intended to be used to interpret the claims. The Abstract section can set forth one or more, but not all exemplary embodiments, of the disclosure, and thus, is not intended to limit the disclosure and the following claims and their equivalents in any way.

The exemplary embodiments described within foregoing Detailed Description have been provided for illustrative purposes, and are not intended to be limiting. Other exemplary embodiments are possible, and modifications can be made to the exemplary embodiments while remaining within the spirit and scope of the disclosure. The foregoing Detailed Description has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing circuitry). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The foregoing Detailed Description fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. A multi-chip package, comprising:
an enclosed integrated circuit (IC) package comprising:
a first plurality of conductive layers disposed onto a semiconductor substrate, the first plurality of conductive layers including a first portion of a first solenoid inductor and a first portion of a second solenoid inductor,
wherein the semiconductor substrate comprises:
a plurality of through silicon via (TSV) structures to electrically couple the first portion of the first solenoid inductor and a second portion of the first solenoid inductor; and
an enclosing IC package comprising:
a plurality of system on chip (SoC) packages,
a first interposer, situated onto the plurality of SoC packages, having a second plurality of conductive layers, wherein a second portion of the second solenoid inductor and a first portion of a third solenoid inductor are situated within the second plurality of conductive layers, a second interposer, situated onto the enclosed IC package, having a third plurality of conductive layers, wherein the second portion of the first solenoid inductor and a second portion of the third solenoid inductor are situated within the third plurality of conductive layers, a plurality of regions of a molding compound situated between the first interposer and the second interposer, wherein the plurality of regions of the molding compound include a plurality of via structures to electrically couple the first portion of the third solenoid inductor and the second portion of the third solenoid inductor, and a plurality of regions of conductive material situated between the enclosed IC package and the first interposer to electrically couple the first portion of the second solenoid inductor and the second portion of the second solenoid inductor.

2. The multi-chip package of claim 1, wherein the enclosing IC package further comprises:

a non-conductive platform situated onto the first interposer to mechanically connect the enclosed IC package and the first interposer, the non-conductive platform including the plurality of regions of conductive material.

3. The multi-chip package of claim 1, wherein the first solenoid inductor comprises:

a first three-dimensional structure of conductive material having first turns rotating in a counter-clockwise direction between an input of the first solenoid inductor and an output of the first solenoid inductor, wherein the second solenoid inductor comprises:

a second three-dimensional structure of the conductive material having second turns rotating in the counter-clockwise direction between an input of the second solenoid inductor and an output of the second solenoid inductor, and wherein the third solenoid inductor comprises:

a third three-dimensional structure of the conductive material having third turns rotating in the counter-clockwise direction between an input of the third solenoid inductor and an output of the third solenoid inductor.

4. The multi-chip package of claim 3, wherein the first solenoid inductor is arranged to traverse a first current there through to generate a first magnetic field, and wherein the second solenoid inductor is arranged to traverse a second current there through to generate a second magnetic field.

5. The multi-chip package of claim 4, wherein the first solenoid inductor is arranged to traverse the first current there through in the counter-clockwise direction between the input of the first solenoid inductor and the output of the first solenoid inductor to generate the first magnetic field, and wherein the second solenoid inductor is arranged to traverse the first current there through in the counter-clockwise direction to generate the second magnetic field, wherein the first magnetic field and the second magnetic field are constructive to increase an inductance of the third solenoid inductor.

6. The multi-chip package of claim 4, wherein the first solenoid inductor is arranged to traverse the first current there through in a clockwise direction between the output of the first solenoid inductor and the input of the first solenoid inductor to generate the first magnetic field, and wherein the second solenoid inductor is arranged to traverse the first current there through in the counter-clockwise direction between the input of the second solenoid inductor and the output of the second solenoid inductor to generate the second magnetic field, wherein the first magnetic field and the second magnetic field are destructive to decrease an inductance of the third solenoid inductor.

7. The multi-chip package of claim 4, wherein an inductance of the third solenoid inductor is related to the first magnetic field and the second magnetic field.

8. The multi-chip package of claim 1, wherein at least one of the plurality of SoC packages comprises:

a dynamic inductance control circuit configured to generate a control current to be applied to the first solenoid inductor or the second solenoid inductor, and wherein the control current is adjustable to control an inductance of the third solenoid inductor.

9. The multi-chip package of claim 1, wherein the first solenoid inductor and the second solenoid inductor are arranged to be situated within the third solenoid inductor.

10. An enclosed integrated circuit (IC) package, comprising:

a semiconductor substrate; and a first plurality of conductive layers disposed onto the semiconductor substrate, the first plurality of conductive layers including a first portion of a first solenoid inductor and a first portion of a second solenoid inductor, wherein the semiconductor substrate comprises:

a plurality of through silicon via (TSV) structures electrically coupled to the first portion of the first solenoid inductor and wherein the enclosed IC package is configured to be electrically and mechanically coupled to an enclosing IC package to form a multi-chip package, the enclosing IC package comprising a second portion of the first solenoid inductor and a second portion of the second solenoid inductor.

11. The enclosed IC package of claim 10, wherein the enclosing IC package further comprises:

a plurality of system on chip (SoC) packages, a first interposer, situated onto the plurality of SoC packages, having a second plurality of conductive layers, wherein the second portion of the second solenoid inductor and a first portion of a third solenoid inductor are situated within the second plurality of conductive layers, a second interposer, situated onto the enclosed IC package, having a third plurality of conductive layers, wherein a second portion of the first solenoid inductor and a second portion of the third solenoid inductor are situated within the third plurality of conductive layers, a plurality of regions of a molding compound situated between the first interposer and the second interposer, wherein the plurality of regions of the molding compound include a plurality via structures to electrically couple the first portion of the third solenoid inductor and the second portion of the third solenoid inductor, and a plurality of regions of conductive material situated between the enclosed IC package and the first interposer to electrically couple the first portion of the second solenoid inductor and the second portion of the second solenoid inductor.

12. The enclosed IC package of claim 11, wherein the first portion of the first solenoid inductor is electrically coupled to the second portion of the first solenoid inductor to form the first solenoid inductor and the first portion of the second solenoid inductor is electrically coupled to the second portion of the second solenoid inductor to form the second solenoid inductor when the enclosed IC package is mechanically and electrically connected to the enclosing IC package.

13. The enclosed IC package of claim 12, wherein the first solenoid inductor is arranged to traverse a first current there through to generate a first magnetic field, and
wherein the second solenoid inductor is arranged to traverse a second current there through to generate a second magnetic field.

14. The enclosed IC package of claim 13, wherein the first solenoid inductor is arranged to traverse the first current there through in a counter-clockwise direction between an input of the first solenoid inductor and an output of the first solenoid inductor to generate the first magnetic field,
wherein the second solenoid inductor is arranged to traverse the first current there through in the counter-clockwise direction between an input of the second solenoid inductor and an output of the second solenoid inductor to generate the second magnetic field, and
wherein the first magnetic field and the second magnetic field are constructive to increase an inductance of the third solenoid inductor.

15. The enclosed IC package of claim 13, wherein the first solenoid inductor is arranged to traverse the first current there through in a clockwise direction between an output of the first solenoid inductor and an input of the first solenoid inductor to generate the first magnetic field,
wherein the second solenoid inductor is arranged to traverse the first current there through in a counter-clockwise direction between an input of the second solenoid inductor and an output of the second solenoid inductor to generate the second magnetic field, and
wherein the first magnetic field and the second magnetic field are destructive to decrease an inductance of the third solenoid inductor.

16. A method for fabricating a multi-chip package, the method comprising:
attaching at least one system on chip (SOC) on a first side of a first interposer;
forming through interpose vias (TIVs) on a second side of the first interposer opposite to the first side, wherein each of the first and second sides of the first interposer comprises a redistribution layer configured to mechanically and electrically connect, respectively, to the at least one SOC and the TIVs;
attaching an enclosed integrated circuit (IC) package to the second side of the first interposer so that a first conductive layer on a first side of the enclosed IC package is electrically coupled to a first portion of the redistribution layer on the second side of the first interposer, wherein the first conductive layer on a first side of the enclosed integrated circuit package and the first portion of the redistribution layer on the second side of the first interposer form a first solenoid inductor;
attaching a second interposer on a second side of the enclosed IC package, opposite to the first side of the enclosed IC package, so that a second conductive layer on the second side of the enclosed IC package is electrically coupled to a first portion of an redistribution layer on a first side of the second interposer and a second portion of the redistribution layer on the first side of the second interposer is electrically coupled through the TIVs to a second portion of the redistribution layer on the second side of the first interposer, wherein the second conductive layer on the second side of the enclosed IC package and the first portion of the redistribution layer on the first side of the second interposer form a second solenoid inductor, and wherein the second portion of the redistribution layer on the first side of the second interposer, the TIVs, and the second portion of the redistribution layer on the second side of the first interposer form a third solenoid inductor.

17. The method of claim 16, further comprising:
forming electrical connections to a second side of the second interposer, opposite to the first side of the second interposer, so that the electrical connections are electrically coupled to the first, second, and third solenoids.

18. The method of claim 16, wherein attaching the enclosed IC package to the second side of the first interposer comprises mechanically connecting the first conductive layer on the first side of the enclosed IC package to the first portion of the redistribution layer on the second side of the first interposer through bump connections.

19. The method of claim 16, wherein attaching the second interposer on the second side of the enclosed IC package to the first portion of the redistribution layer on the first side of the second interposer comprises mechanically connecting through silicon vias (TSVs) on the second side of the enclosed IC package to the first portion of the redistribution layer on the first side of the second interposer.

20. The method of claim 16, wherein attaching the enclosed IC package to the second side of the first interposer comprises forming an non-conductive platform that surrounds a portion of the first solenoid inductor.

* * * * *